(12) United States Patent  
Ye et al.

(10) Patent No.: US 7,488,933 B2  
(45) Date of Patent: Feb. 10, 2009

(54) METHOD FOR LITHOGRAPHY MODEL CALIBRATION

(75) Inventors: Jun Ye, Palo Alto, CA (US); Yu Cao, Cupertino, CA (US); Guangqing Chen, Fremont, CA (US); Stefan Hunsche, Sunnyvale, CA (US)

(73) Assignee: Brion Technologies, Inc., Santa Clara, CA (US)

( * ) Notice: Subject to any disclaimer, the term of this patent is extended or adjusted under 35 U.S.C. 154(b) by 343 days.

(21) Appl. No.: 11/461,929

(22) Filed: Aug. 2, 2006

(65) Prior Publication Data

US 2007/0032896 A1 Feb. 8, 2007

Related U.S. Application Data

(60) Provisional application No. 60/705,667, filed on Aug. 5, 2005.

(51) Int. Cl.  
G12B 13/00 (2006.01)

(52) U.S. Cl. .................. 250/252.1; 716/21

(58) Field of Classification Search .......... 250/252.1; 716/21  
See application file for complete search history.

(56) References Cited

U.S. PATENT DOCUMENTS

| | | | | |
|---|---|---|---|---|
| 6,115,108 | A * | 9/2000 | Capodieci | 355/77 |
| 6,787,789 | B2 * | 9/2004 | Van Der Laan | 250/548 |
| 6,803,554 | B2 * | 10/2004 | Ye et al. | 250/208.1 |
| 6,806,456 | B1 * | 10/2004 | Ye et al. | 250/208.1 |
| 6,828,542 | B2 * | 12/2004 | Ye et al. | 250/208.1 |
| 6,884,984 | B2 * | 4/2005 | Ye et al. | 250/208.1 |
| 6,969,837 | B2 * | 11/2005 | Ye et al. | 250/208.1 |
| 6,969,864 | B2 * | 11/2005 | Ye et al. | 250/559.4 |
| 7,003,758 | B2 * | 2/2006 | Ye et al. | 716/21 |
| 7,053,355 | B2 * | 5/2006 | Ye et al. | 250/208.1 |
| 2004/0156030 | A1 * | 8/2004 | Hansen | 355/67 |
| 2004/0158808 | A1 * | 8/2004 | Hansen | 716/21 |
| 2006/0114437 | A1 * | 6/2006 | Akhssay et al. | 355/55 |
| 2006/0273266 | A1 * | 12/2006 | Preil et al. | 250/548 |

OTHER PUBLICATIONS

H.J. Levinson, "Lithography Process Control," Solid State Technology, vol. 40, No. 11, pp. 141-149 (Nov. 1997).

(Continued)

Primary Examiner—David P Porta  
Assistant Examiner—Mark R Gaworecki  
(74) Attorney, Agent, or Firm—Pillsbury Winthrop Shaw Pittman LLP

(57) ABSTRACT

A method for separately calibrating an optical model and a resist model of lithography process using information derived from in-situ aerial image measurements to improve the calibration of both the optical model and the resist model components of the lithography simulation model. Aerial images produced by an exposure tool are measured using an image sensor array loaded into the exposure tool. Multiple embodiments of measuring aerial image information and using the measured aerial image information to calibrate the optical model and the resist model are disclosed. The method of the invention creates more accurate and separable optical and resist models, leading to better predictability of the pattern transfer process from mask to wafer, more accurate verification of circuit patterns and how they will actually print in production, and more accurate model-based process control in the wafer fabrication facility.

104 Claims, 13 Drawing Sheets

OTHER PUBLICATIONS

L. Mantalas and H.J. Levinson, "Semiconductor Process Control," Handbook of Critical Dimension Metrology and Process Control, SPIE Critical Review of Optical Science and Technology, vol. CR52, pp. 230-266 (1994).

R. Herschel and C. Mack, "Lumped Parameter Model for Optical Lithography," Lithography for VLSI, VLSI Electronics—Microstructure Science, Academic Press, pp. 19-55 (1987).

C.A. Mack, "Enhanced Lumped Parameter Model for Photolithography," Optical/Laser Microlithography VII, Proc. SPIE vol. 2197, pp. 501-510 (1994).

J. Byers et al., "3D Lumped Parameter Model for Lithographic Simulation," Optical/Laser Microlithography XV, Proc. SPIE vol. 4691, pp. 125-137 (2002).

C.A. Mack, "New Kinetic Model for Resist Dissolution," Jour. Electrochemical Society, vol. 139, No. 4, pp. L35-L37 (Apr. 1992).

F.H. Dill et al., "Characterization of Positive Photoresist," IEEE Trans. Electronic Devices, ED-22, No. 7, pp. 445-452 (Jul. 1975).

G. Gallatin, "Resist Blur and Line Edge Roughness," Optical Microlithography XVIII, Proc. SPIE vol. 5754, pp. 38-52 (2005).

S. Renwick et al., "Size-Dependant Flare and its Effect on Imaging," Optical Microlithography XVI, Proc. SPIE Vo. 5040, pp. 24-32 (2003).

C. Progler and A. Wong, "Zernike Coefficients: Are They Really Enough?," Proc. SPIE vol. 4000, pp. 40-52 (2000).

K. Matsumoto, "Analysis of Imaging Performance Degradation," Optical Microlithography XVI, Proc. SPIE vol. 5040, pp. 131-138 (2003).

B. La Fontaine et al., "Analysis of Flare and its Impact on Low-k1 KrF and ArF Lithography," Optical Lithography XV, Proc.SPIE vol. 4691, pp. 44-56 (2002).

C. Mack, "Measuring and Modeling Flare in Optical Lithography," Optical Microlithography XVI, Proc. SPIE, vol. 5040, pp. 151-161 (2003).

S. Renwick, "Flare and its Effects on Imaging," Optical Microlithography XVII, Proc. SPIE Vo. 5377, pp. 442-450 (2004).

K. Lai et al., "Scattered Light: The Increasing Problem for 193 nm Exposure Tools and Beyond," Optical Microlithography XIV, Proc. SPIE vol. 4346, pp. 1424-1435 (2001).

K. Adam et al., "Simplified Models for Edge Transitions in Rigorous Mask Modeling," Optical Microlithogrpahy XIV, Proc. SPIE vol. 4346, pp. 331-334 (2001).

K.D. Lucas et al., "Efficient and Rigorous Three-Dimensional Model for Lithography Simulation," J. Opt. Soc. Am., vol. 13, p. 2187 (1996).

* cited by examiner

METHOD FOR LITHOGRAPHY MODEL CALIBRATION

CROSS-REFERENCE TO RELATED APPLICATION

This application claims the benefit of U.S. Provisional Patent Application No. 60/705,667, entitled "System and Method for Lithography Model Calibration," the subject matter of which is hereby incorporated by reference in its entirety.

FIELD OF THE INVENTION

This invention relates generally to simulation of lithography processes, and more particularly to a method for calibrating a model of a lithography process.

BACKGROUND

In the semiconductor industry, microlithography (or simply lithography) is the process of printing circuit patterns on a semiconductor wafer (for example, a silicon or GaAs wafer). Currently, optical lithography is the predominant technology used in volume manufacturing of semiconductor devices and other devices such as flat-panel displays. Such lithography employs light in the visible to deep ultraviolet spectrum range to expose photo-sensitive resist on a substrate. In the future, extreme ultraviolet (EUV) and soft x-rays may be employed. Following exposure, the resist is developed to yield a relief image.

In optical lithography, a photomask (often called a mask or a reticle) that serves as a template for the device structures to be manufactured is first written using electron-beam or laser-beam direct-write tools. A typical photomask for optical lithography consists of a glass (or quartz) plate of six to eight inches on a side, with one surface coated with a thin metal layer (for example, chrome) of a thickness of about 100 nm. The device pattern is etched into the metal layer, hence allowing light to transmit through the clear areas. The areas where the metal layer is not etched away block light transmission. In this way, a pattern may be projected onto a semiconductor wafer.

The mask contains certain patterns and features that are used to create desired circuit patterns on a wafer. The tool used in projecting the mask image onto the wafer is called a "stepper" or "scanner" (hereinafter collectively called "exposure tool"). FIG. 1 is a diagram of an optical projection lithographic system 10 of a conventional exposure tool. System 10 includes an illumination source 12, an illumination pupil filter 14, a lens subsystem 16a-c, a mask 18, a projection pupil filter 20, and a wafer 22 on which the aerial image of mask 18 is projected. Illumination source 12 may be laser source operated, for example, at UV (ultra-violet) or DUV (deep ultra-violet) wavelengths. The light beam of illumination source 12 is expanded and scrambled before it is incident on illumination pupil 14. Illumination pupil 14 may be a simple round aperture, or may have specifically designed shapes for off-axis illumination. Off-axis illumination may include, for example, annular illumination (i.e., illumination pupil 14 is a ring with a designed inner and outer radius), quadruple illumination (i.e., illumination pupil 14 has four openings in the four quadrants of the pupil plane), and other shapes like dipole illumination.

After illumination pupil 14, the light passes through the illumination optics (for example, lens subsystem 16a) and is incident on mask 18, which contains the circuit pattern to be imaged on wafer 22 by the projection optics. As the desired pattern size on wafer 22 becomes smaller and smaller, and the features of the pattern become closer and closer to each other, the lithography process becomes more challenging. In an effort to improve imaging quality, current processing techniques employ resolution enhancement techniques ("RET"), such as, for example, optical proximity correction ("OPC"), phase shift masks ("PSM"), off-axis illumination ("OAI"), and condenser and exit pupil filters. Many of the RET technologies are applied on or directly to mask 18. For example, OPC and PSM, which modify the light waves to compensate for the imperfection of the imaging properties of the projection optics (for example, the OPC technology is used to compensate for optical or processing related proximity effects, e.g., due to light interference), and/or take advantage of designed light interferences to enhance the imaging quality, for example, the PSM technology is used to create phase shifting between neighboring patterns to enhance resolution. Notably, mask 18 may not be "perfect," due to its own manufacturing process. For example, corners on mask 18 may not be sharp but may be rounded and/or the linewidth may have a bias from design value where the bias may also depend on the designed linewidth value and neighboring patterns. These imperfections on mask 18 may affect the final imaging quality.

The projection optics (for example, lens subsystems 16b and 16c, and projection pupil filter 20) images mask 18 onto wafer 22. Pupil 20 of the projection optics limits the maximum spatial frequency of the mask pattern that can be passed through the projection optics system. A number called "numerical aperture" or NA often characterizes pupil 20. There are also proposed RET techniques that modify pupil 20, which are generally called pupil filtering. Pupil filtering may include modulating both the amplitude and the phase of the light beams passing through pupil 20.

Due to the wavelength of light being finite, and current techniques employing wavelengths that are larger than the minimum linewidth that is printed on wafer 22, there are typically significant light interference and diffraction effects affecting the imaging process. The imaging process does not produce at the wafer plane a perfect replication of the pattern on mask 18. In order to predict the actual imaging performance, current techniques employ physical theory to simulate and model this imaging process. Further, due to the high NA value of current lithography tools, different polarizations of the light provide different imaging properties. To more accurately model the imaging process, a vector-based model may be used that incorporates polarization effects.

The projection optics of system 10 may be diffraction-limited. However, lens subsystem 16b and 16c in the projection optics are most often not completely "perfect." These imperfections may be due to aberrations, which are often modeled as some undesired phase modulation at the plane of pupil 20, and are commonly represented by a set of Zernike coefficients. After the light finally reaches the surface of wafer 22, it will further interact with the coatings on wafer 22 (for example, the photoresist). In this regard, different resist thickness, different optical properties of the resist (for example, its refractive index), and different material layers under the resist (for example, a bottom-anti-reflection-coating or BARC), may further affect the imaging characteristics. Some of these effects may also be abstracted by a modulation at the pupil plane.

When the resist is exposed by the projected image and thereafter baked and developed, the resist tends to undergo complex chemical and physical changes. The final resist patterns are typically characterized by their critical dimensions, or CD, usually defined as the width of a resist feature at the resist-substrate interface. While the CD is usually intended to represent the smallest feature being patterned in the given device, in practice the term CD is used to describe the linewidth of any resist feature.

For a lithography process to pattern a device correctly, the CDs of all critical structures in the device must be patterned to achieve the design target dimensions. Since it is practically impossible to achieve every target CD with no errors, the device is designed with a certain tolerance for CD errors. In this case, the pattern is considered to be acceptable if the CDs of all critical features are within these predefined tolerances. In order for the lithography process to be viable in a manufacturing environment, the full CD distribution must fall within the tolerance limits across a range of process conditions, which represents the typical range of process variation expected to occur in the fab.

The range of process conditions over which the CD distribution will meet the specification limits is referred to as the "process window." While many variables must be considered to define the full process window, in lithography processes it is typical to describe only the two most critical process parameters, focus and exposure offsets, in defining the process window. A process may be considered to have a manufacturable process window if the CDs fall within the tolerance limits, e.g., +/−10% of the nominal feature dimension, over a range of focus and exposure conditions which are expected to be maintainable in production. FIG. 2 is a diagram of a process window 30 as an area in exposure-defocus (E-D) space in which CDs are within tolerance limits for up to +/−150 nm of focus error and +/−15% exposure error. It should be noted that while this may seem to be an unusually large range of exposure variation, given that state of the art exposure tools can easily control the energy delivered at the wafer plane to less than 1% variation, the exposure dose tolerance must be significantly larger than the expected variation in energy since exposure latitude also serves as a surrogate for a wide range of other process variations such as film thickness, reflectivity, resist processing, develop processing, exposure tool aberrations, and others. It should also be noted that different pattern types or sizes usually have different process windows, and that the manufacturability of a device design depends on the common process window of all critical patterns.

First-principle and empirical models have been developed to simulate lithography processes, including the formation of the aerial image (the image projected onto wafer 22), transfer of the aerial image into a latent image in the resist film, and baking and developing of the resist to form the final three-dimensional resist pattern. These models are vital in verifying that the complex circuit patterns, including RET enhancements, will be reproduced correctly and with a manufacturable process window at the wafer level. The time and expense needed to create test masks, expose them, process test wafers and determine the final dimensions experimentally would be prohibitive without the savings in time and processing cost made possible by simulation. Simulation can also be used to study the patterning of the full chip image and predict any weak spots in the design, for example by a process window analysis (see U.S. Pat. No. 7,003,758, the subject matter of which is hereby incorporated by reference in its entirety), to develop the OPC and PSM models used in developing and implementing the RETs used to create the mask pattern, and to develop model-based advanced process control systems used to monitor and control the lithography process in production (see "Lithography Process Control," H. J. Levinson, Solid State Technology, Vol. 40, No. 11, pp. 141-149 (November 1997); "Semiconductor Process Control," L. Mantalas and H. Levinson, Handbook of Critical Dimension Metrology and Process Control, K. Monahan, editor, SPIE Critical Review of Optical Science and Technology, Vol. CR52, pp. 230-266 (1994)).

In developing and calibrating the models used for all aspects of lithography simulation, one of the most difficult challenges has been the correct separation of the model into its optical and resist components, where the optical model module accurately represents the formation of the aerial image by the exposure tool and the resist model module accurately represents the absorption of the incident aerial image by the resist as well as the development of the exposed resist to form the final three-dimensional resist pattern. A model of a lithography process includes an optical model module, and may optionally include a resist model module, a mask model module, and other appropriate model modules. The model modules of the model of the lithography process will be referred to herein as models, e.g., the optical model and the resist model, for simplicity.

Up until now, the only way to calibrate a lithography simulation model has been to process a wafer in an exposure tool, develop the resist images, measure the CDs and possibly sidewall angles of the resist profile, then adjust both optical and resist model parameter values to achieve the best possible agreement between predicted and measured resist observations. FIG. 3 is a flowchart of a prior art method used to process wafers in an exposure tool and collect data using any current CD metrology tool such as a CD Scanning Electron Microscope (CD-SEM), scatterometer (SCD), optical CD (OCD), electrical linewidth (ELM) or Atomic Force Microscopy (AFM) tool. FIG. 4 is a flowchart of a prior art method for calibrating a model of a lithography process, where simulated resist data (CDs, sidewall angles, contours and/or three-dimensional profiles) are compared to measured resist data in step 420 to evaluate the model quality and any differences between the modeled and the measured results are used to modify both the optical and resist models in step 424. In the method of FIG. 4, the model only includes an optical model and a resist model for ease of illustration. Assuming that the measured data are sufficiently accurate, any differences between the model predictions for the resist patterns and the measurements of the actual resist patterns could be due to inaccuracy in either the resist model or the optical model.

There is presently no unambiguous method to separate which model component needs to be adjusted in order to reduce such differences, and thereby to improve the predictability of the simulation model. Consequently, often a resist parameter may be changed to compensate for an incorrect setting of an optical parameter, or vice versa. Selection of a non-optimal parameter set often results in incomplete convergence of the model fitting procedure, or, if the model fitting does converge, the values to which the parameters converge often have little relationship to physical reality and therefore provide limited predictability.

In this current environment, the model prediction may be optimized for a restricted set of calibration test patterns, but the terms in the model may not be correct, leading to incorrect predictions of patterns that were not included in the set of calibration test patterns. In addition, if a model is calibrated without achieving a significant match between model parameters and real physical parameters, model predictability will be limited in the following respect: if one specific parameter is deliberately changed in the process, such as the partial coherence (sigma) of the illuminator or the numerical aperture (NA) of the projection lens, simply changing that parameter in the model will most likely not give the correct results. A change in one known parameter may require corresponding changes in multiple modeling terms to restore the model accuracy. In effect, the model terms, although they are given names corresponding to real physical parameters, do not actually represent those specific parameters but rather they represent the collective effect of numerous different parameters convolved into empirical modeling terms.

In many cases, developers of lithography simulation models have recognized the difficulty in developing truly separable models and have tacitly admitted that the model parameters do not bear a unique one-to-one correspondence with the physical parameters for which they are named. In such "lumped parameter" models, the model terms are given physical sounding names, but the values which these parameters are set to, in order to achieve the best matching to experimental data, do not actually correspond to the physical value those parameters would have if they could be individually measured in the process. (See "Lumped Parameter Model for Optical Lithography," R. Hershel and C. Mack, Ch. 2, Lithography for VLSI, VLSI Electronics—Microstructure Science, R. K. Watts and N. G. Einspruch, eds., Academic Press (New York), pp. 19-55 (1987); "Enhanced Lumped Parameter Model for Photolithography," C. A. Mack, Optical/Laser Microlithography VII, Proc. SPIE Vol. 2197, pp. 501-510 (1994); "3D Lumped Parameter Model for Lithographic Simulation," J. Byers., M. D. Smith, C. A. Mack, Optical/Laser Microlithography XV, A. Yen, editor, Proc. SPIE Vol. 4691, pp. 125-137 (2002)). As a result, if any term in the real physical process is deliberately changed, it is not sufficient to change the one corresponding term in the model. Instead, the entire model must be recalibrated. In many cases, even if the process change is only in the optical parameters, all of the resist parameters in the model may also require returning, and vice versa: if the change is only in the resist parameters, the optical model might also need to be returned. Thus, if an optical parameter such as NA or sigma is changed, the optical and resist models both need to be returned. This indicates that such models and the methods used to calibrate the models do not achieve true, physically significant model separation. As a result, any change in the process requires extensive, time consuming model recalibration.

Other models have been developed which take the lack of separability to such an extreme that they do not even attempt to break the model into separate optical and resist components. Examples of such models are the class of lumped parameter or behavioral models often used in OPC implementation. The use of non-separable models means that an OPC model that is optimized for a given exposure tool and a given resist process is not easily transferable to another tool or another resist process. Due to the convoluted mapping of real physical parameters with these OPC model parameters, an entirely new model would have to be developed even if process changes seem relatively minor.

Some efforts have been made to develop first-principle resist models (see "New Kinetic Model for Resist Dissolution," C. A. Mack, Jour. Electrochemical Society, Vol. 139, No. 4, pp. L35-L37, April 1992) and to measure the resist parameters independently through specific tests, such as dose-to-clear, contrast curves, and development rate monitors (see "Characterization of Positive Photoresist," F. H. Dill et al., IEEE Trans. Electronic Devices, ED-22, No. 7, pp. 445-452, July 1975). The goal of such first-principle approaches is to provide truly separable models such that the terms in the models do bear a unique one-to-one correspondence with the physical parameters of interest. Efforts to implement workable first-principle models have been largely unsuccessful due to a number of factors: the large number of resist parameters required to accurately describe the complex kinetics of acid and base diffusion in modern acid catalyzed resist systems as well as the surface and substrate interaction effects in these resists; the sensitivity to the various bake temperatures and thermal cycles; the difficulty in accurately modeling the development path at the developer-resist interface, where the resist film undergoes a complex phase transformation from solid to soluble gel; and the molecular level perturbations of the acid and base species in the resist which gives rise to stochastic line edge roughness (see "Resist Blur and Line Edge Roughness," G. Gallatin, Optical Microlithography XVIII, B. W. Smith, editor, Proc. SPIE, Vol. 5754, pp. 38-52 (2005)).

Even if a microscopic resist model could be simplified from the physical reality to a manageable set of parameters, the linkage between the resist model and optical model is still difficult to break due to the lack of understanding of the exact optical conditions in the exposure tool. While it is common to represent the illumination profile by a simple set of parameters, such as the single parameter sigma for conventional illumination or the two parameters inner and outer sigma for annular illumination, the actual pupil fill function is far more complex and non-uniform, both spatially in the mask plane and in terms of the pupil filling factor in the conjugate plane (see "Size-Dependent Flare and its Effect on Imaging," Stephen Renwick et al., Optical Microlithography XVI, A. Yen, editor, Proc. SPIE Vol. 5040, pp. 24-32 (2003)). Similarly, the wavefront will be significantly aberrated from its idealized representation by lower order terms, often represented as Zernike polynomials (see "Zernike Coefficients: Are They Really Enough?," C. Progler and A. Wong, Proc. SPIE, Vol. 4000, pp. 40-52 (2000); "Analysis of Imaging Performance Degradation," K. Matsumoto, Optical Microlithography XVI, A. Yen, editor, Proc. SPIE, Vol. 5040, pp. 131-138 (2003)), as well as mid-to-low spatial frequency terms such as flare (see "Analysis of Flare and its Impact on Low-k1 KrF and ArF Lithography," Bruno La Fontaine et al., Optical Microlithography XV, A. Yen, editor, Proc. SPIE, Vol. 4691, pp. 44-56 (2002); "Measuring and Modeling Flare in Optical Lithography," Chris Mack, Optical Microlithography XVI, A. Yen, editor, Proc. SPIE, Vol. 5040, pp. 151-161 (2003); "Flare and its Effects on Imaging," Stephen P. Renwick, Optical Microlithography XVII, B. W. Smith, editor, Proc. SPIE, Vol. 5377, pp. 442-450 (2004); "Scattered Light: The Increasing Problem for 193 nm Exposure Tools and Beyond," K. Lai, C. Wu, and C. Progler, Optical Microlithography XIV, C. Prolger, editor, Proc. SPIE, Vol. 4346, pp. 1424-1435 (2001)). These deviations from idealized theory can cause extensive proximity effects which are difficult to separate from resist processing effects.

SUMMARY OF THE INVENTION

A method for separately calibrating an optical model and a resist model of a lithography process uses information derived from in-situ aerial image measurements to improve the calibration of both the optical model and the resist model components of the lithography simulation model. Aerial images produced by an exposure tool are measured using an image sensor array loaded into the exposure tool. Multiple embodiments of measuring aerial image information and using the measured aerial image information to calibrate the optical model and the resist model are disclosed. The method of the invention creates more accurate and separable optical and resist models, leading to better predictability of the pattern transfer process from mask to wafer, more accurate verification of circuit patterns and how they will actually print in production, and more accurate model-based process control in the wafer fabrication facility.

In one embodiment, a method for calibrating a model of a lithography process includes selecting a model for a lithography process, the model including an optical model and a resist model, the optical model having initial values of optical model parameters and the resist model having initial values of resist model parameters, measuring an aerial image using an image sensor array to produce a measured sensor image, the aerial image being produced by a lithography tool from a mask created using circuit design data, simulating the lithography process using the optical model and the circuit design data to produce a simulated aerial image of circuit design patterns, determining differences between the simulated aerial image and the measured sensor image, and modifying the values of the optical model parameters based on the differences between the simulated aerial image and the measured sensor image to identify optimal values for the optical model parameters, wherein a simulated aerial image produced using the optimal values for the optical model parameters is an optimal simulated aerial image that is a best match for the measured sensor image.

The method further includes processing a wafer using the lithography process and the mask to produce printed resist patterns, measuring the printed resist patterns to produce measured resist patterns, simulating formation of resist patterns on a wafer using the resist model and the optimal simulated aerial image to produce simulated resist patterns, determining differences between the simulated resist patterns and the measured resist patterns, and modifying the values of the resist model parameters based on the differences between the simulated resist patterns and the measured resist patterns to identify optimal values for the resist model parameters, wherein simulated resist patterns produced using the optimal values for the resist model parameters are optimal simulated resist patterns that are a best match for the measured resist patterns.

DETAILED DESCRIPTION OF THE INVENTION

In one embodiment, the method of the invention for separately calibrating an optical model and a resist model of a lithography process includes measuring in-situ the aerial images formed in an exposure tool, independent of any resist effects. Either the measured aerial images themselves or other metrics derived from the measured aerial images are used to improve the calibration of the optical model that will be used in a simulation of the lithography process. By improving the tuning of the optical model using measured aerial image information, a more accurate representation of the optical model itself is developed, and by separating the optical model and the resist model, a more accurate resist model is developed, leading to truly separable models bearing maximum physical significance to the lithography process.

Herein, an image of a mask pattern formed by the exposure tool and projected through the air and incident upon a photoresist-coated wafer surface is referred to as an "aerial image." It is to be understood that the aerial image may include interaction terms between the incident radiation and any multiple thin films on a target wafer such as polarization effects, reflection and refraction effects, and the propagation of the incident radiation into and throughout the resist film. In addition, state of the art immersion lithography tools may use a layer of water or other immersion fluid between the final lens element and the resist or topcoat surface, so that strictly speaking there is no aerial image, but rather an "immersion image." For the purposes of the invention, an immersion image is equivalent to an aerial image.

Figure 5A:
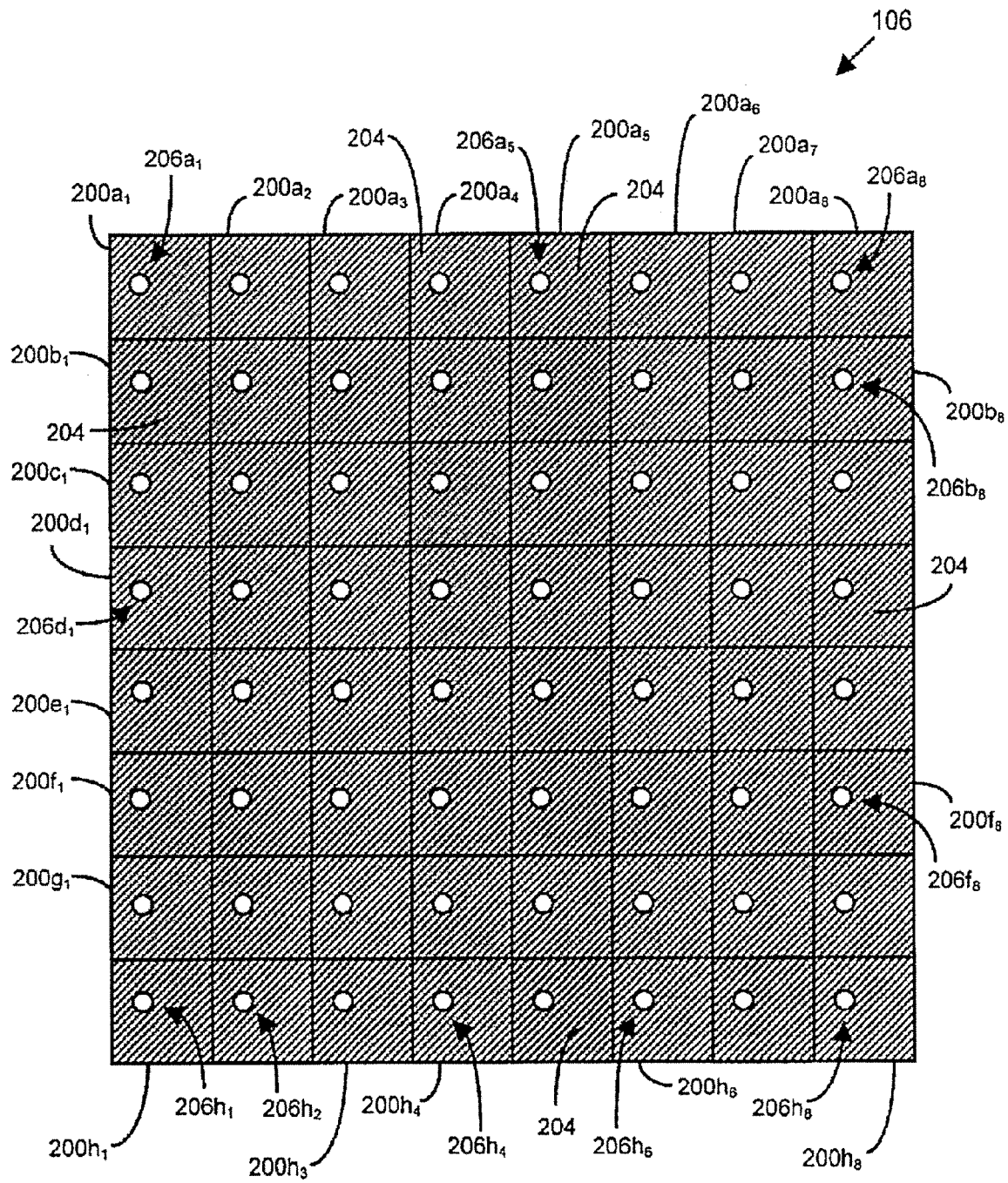
FIG. 5A is a diagram of one embodiment of an image sensor array, according to the invention.

A method and apparatus for collecting in-situ aerial images using an image sensor array have been described in detail in U.S. Pat. Nos. 6,828,542, 6,806,456, 6,803,554, 6,884,984, 6,969,837, 6,969,864, and 7,053,355, the subject matter of which is hereby incorporated by reference in their entirety. FIG. 5A is a diagram of one embodiment of an image sensor array 106, according to the invention. Image sensor array 106 includes a plurality of image sensor elements 200, including $200a_x$ to $200h_x$ (x=1 to 8), that measure, sense, detect and/or collect incident energy or radiation. In those instances where the dimensions of the active areas of image sensor elements 200 are too large to provide a desired or required spatial resolution, it may be necessary to limit, restrict, and/or reduce these sensor cells' active areas that are exposed. Hence, image sensor array 106 includes a patterned opaque film 204 that impedes, obstructs, absorbs, and/or blocks passage of photons or light of a given wavelength (that is, at the wavelength to be measured, sensed or detected by image sensor elements 200). Opaque film 204 includes apertures 206, including $206a_x$ to $206h_x$ (x=1 to 8), so that active areas of image sensor elements 200 are exposed only at apertures 206. As such, the spatial resolution of the energy measured by image sensor elements 200 is enhanced or improved because the portion or area of each image sensor element 200 that is effectively exposed to and/or measures, senses, detects, and/or collects energy or radiation is limited or restricted. Generally, image sensor elements 200 as well as any resolution enhancing measures, e.g., small apertures 206 formed in a light-blocking layer on top of image sensor elements 200, will be arranged on a very regular two-dimensional grid. Image sensor array 106 is preferably included in an image sensor unit that is capable of being loaded into the wafer stage of an exposure tool.

Figure 5B:
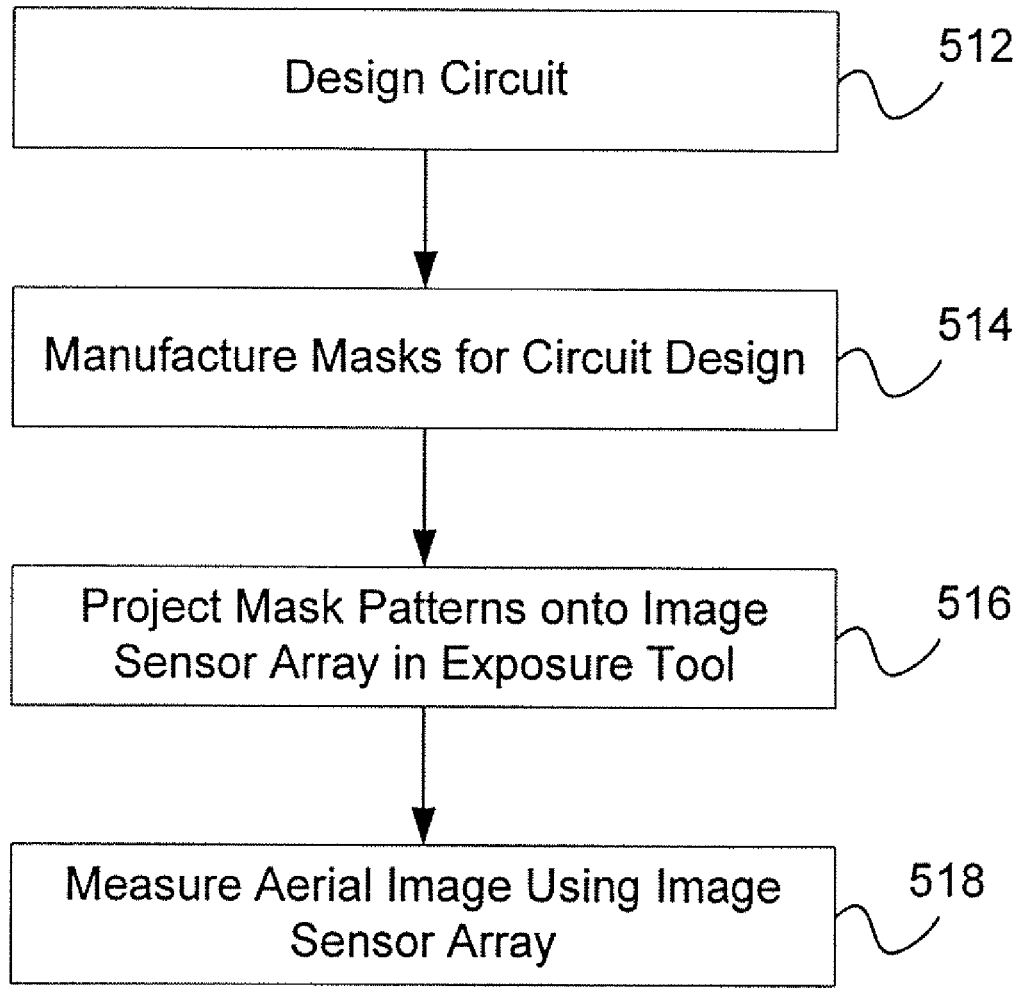
FIG. 5B is a flowchart of method steps for measuring an aerial image in an exposure tool using an image sensor array, according to one embodiment of the invention.

FIG. 5B is a flowchart of method steps for measuring aerial images in an exposure tool using image sensor array 106, according to one embodiment of the invention. In step 512, a circuit desired to be printed onto wafers is designed. In one embodiment, the circuit may be a test circuit that includes test patterns specifically selected for calibration of a model of the lithography process. In step 514, masks are manufactured for the circuit design. A mask set for a test circuit may include only one test mask that includes all of the test patterns for calibrating the model of the lithography process. In step 516, the patterns of the mask or masks are projected onto image sensor array 106 in the exposure tool. Then, in step 518, image sensor array 106 measures the aerial image projected by the exposure tool to produce a measured aerial image. An aerial image measured by image sensor array 106 is referred to herein as a "sensor image."

Figure 6:
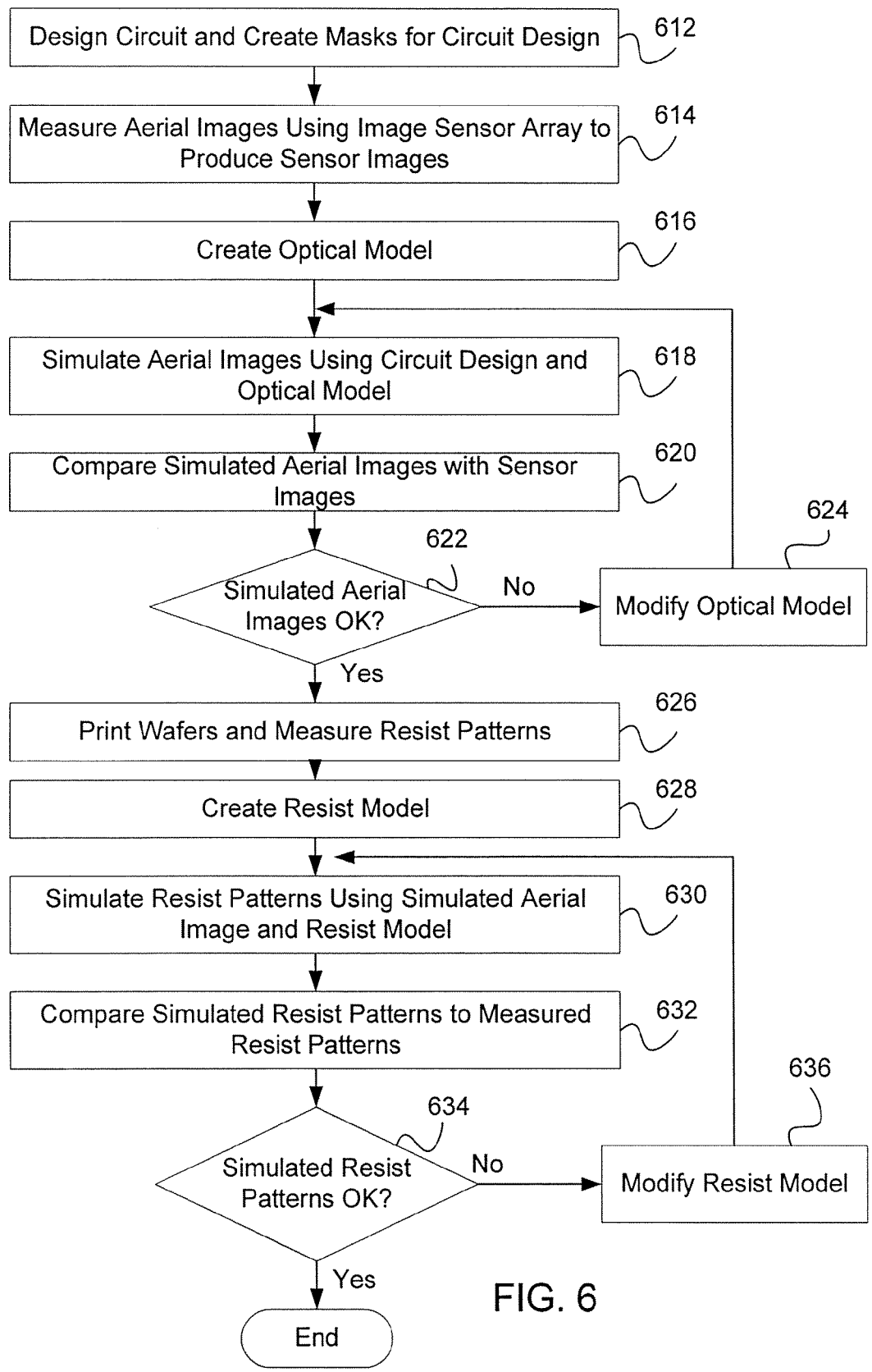
FIG. 6 is a flowchart of method steps for separately calibrating an optical model and a resist model for a lithography process, according to one embodiment of the invention.

FIG. 6 is a flowchart of method steps for separately calibrating an optical model and a resist model of a lithography process, according to one embodiment of the invention. The model of the lithography process may include other model components, for example a mask model and an etch model, in addition to the optical and resist models. For simplicity, only the optical model and resist model are discussed below in conjunction with FIGS. 6-11. In step 612, a circuit is designed and masks are created for the circuit design. To achieve optimal optical model accuracy, a plurality of circuit patterns are selected from actual circuit designs as calibration patterns that will be used for simulation and measurement. The calibration patterns include a wide range of different pattern types and sizes in order to cover a wide area of pattern parameter space (which may be defined in different ways, e.g., by a range of pitches or spatial frequencies). Pattern types may include one-dimensional line/space patterns as well as two-dimensional structures such as contacts, line ends, brick wall patterns, and more complex two-dimensional patterns that would be found in actual integrated circuits. In step 614, the aerial image of the calibration mask is measured in the exposure tool using in-situ image sensor array 106 to produce a sensor image. Image sensor array 106 measures the aerial image exactly as it would be seen by photoresist on a wafer, including the exact same surface interface that exists at the resist-air interface on a production wafer. Next, in step 616, an optical model having optical model parameters is created. Any techniques for creating an optical model of a lithography process are within the scope of the invention. In step 618, an aerial image produced by the exposure tool is simulated using the optical model and the circuit design created in step 612, producing a simulated aerial image. A system for simulating the aerial images is discussed below in conjunction with FIG. 13. The simulation of step 618 and measurement of step 614 may also be performed over a range of exposure conditions such as varying focus and exposure dose, as well as varying other optical parameters, such as NA and sigma.

In step 620, the simulated aerial image and the measured sensor image are compared and differences between the images are determined. If multiple aerial images are measured and simulated, the simulated aerial images for the entire range of patterns and optical conditions are compared to sensor images for the entire range of patterns and optical conditions and differences between the measured and simulated images are determined. These differences may be quantified as values of pattern metrics, such as differential CD values, two-dimensional metrics such as line end pullback and corner rounding, or more complex metrics such as differences between computed and measured contours, differences in image gradients at various points around the contours, differences in image contrast or other parameters. If the differences are sufficiently great that the simulated aerial images do not sufficiently match the sensor images, in step 624 the optical model is modified by changing the values of the optical model parameters in view of these differences. The specifics of determining the changes to be made to the values of the optical model parameters can take any number of algorithmic approaches, such as minimizing the sum of the squares of the differences, removing outliers (fliers), minimizing the maximum residual difference, using weighting factors to preferentially fit specific points, regions, metrics, or optical conditions, and other methods which are well known in the art. The method of FIG. 6 may include any such mathematical formalism for matching simulated and measured results. The method then returns to step 618 and re-simulated aerial images are compared with the sensor images and the optical model is modified until an optimum matching between the pattern metrics of the simulated images and the pattern metrics of the measured in-situ aerial images is achieved. The optical model parameters of the optical model are modified using a model tuning program that utilizes the feedback of the differences between the metrics of the simulated aerial image and the corresponding metrics of the measured sensor image. The optical model is thus calibrated independently of any resist effects.

Next, in step 626, wafers are printed with the patterns of the mask created in step 612 or similar patterns and the printed resist patterns are measured using any conventional technique such as a CD-SEM, tilt SEM, cross sectional SEM (X-SEM), SCD, AFM, or other available data collection tools which are well known in the art. In step 628, a resist model for the lithography process having resist model parameters is created. In step 630, printed resist patterns are simulated using the final simulated aerial image and the resist model. A system for simulating the resist patterns is discussed below in conjunction with FIG. 13. In step 632, the simulated resist patterns are compared to the measured resist patterns and differences between the simulated resist patterns and the measured resist patterns are determined. These differences may be quantified as values of pattern metrics, such as one-dimensional CDs, two-dimensional CDs as listed above, and three-dimensional metrics of the complete pattern profile such as sidewall angle, top profile rounding or T-topping, footing or inverse profiles at the resist-substrate interface and other non-trapezoidal profiles, as well as resist thickness loss during development and other parameters that have been described extensively in the literature. If the differences are sufficiently great that the simulated resist patterns do not sufficiently match the measured resist patterns, in step 636 the resist model is modified by changing the values of the resist model parameters using a model tuning program that utilizes the feedback of the differences between the metrics of the simulated resist patterns and the corresponding metrics of the measured resist patterns. Only the resist model parameters are adjusted in step 636, since the optical model parameters were calibrated earlier. The method then returns to step 630 and simulated resist patterns are compared with the measured resist patterns and the resist model is modified until an optimum matching between the pattern metrics of the simulated resist patterns and the pattern metrics of the measured resist patterns is achieved.

Figure 7:
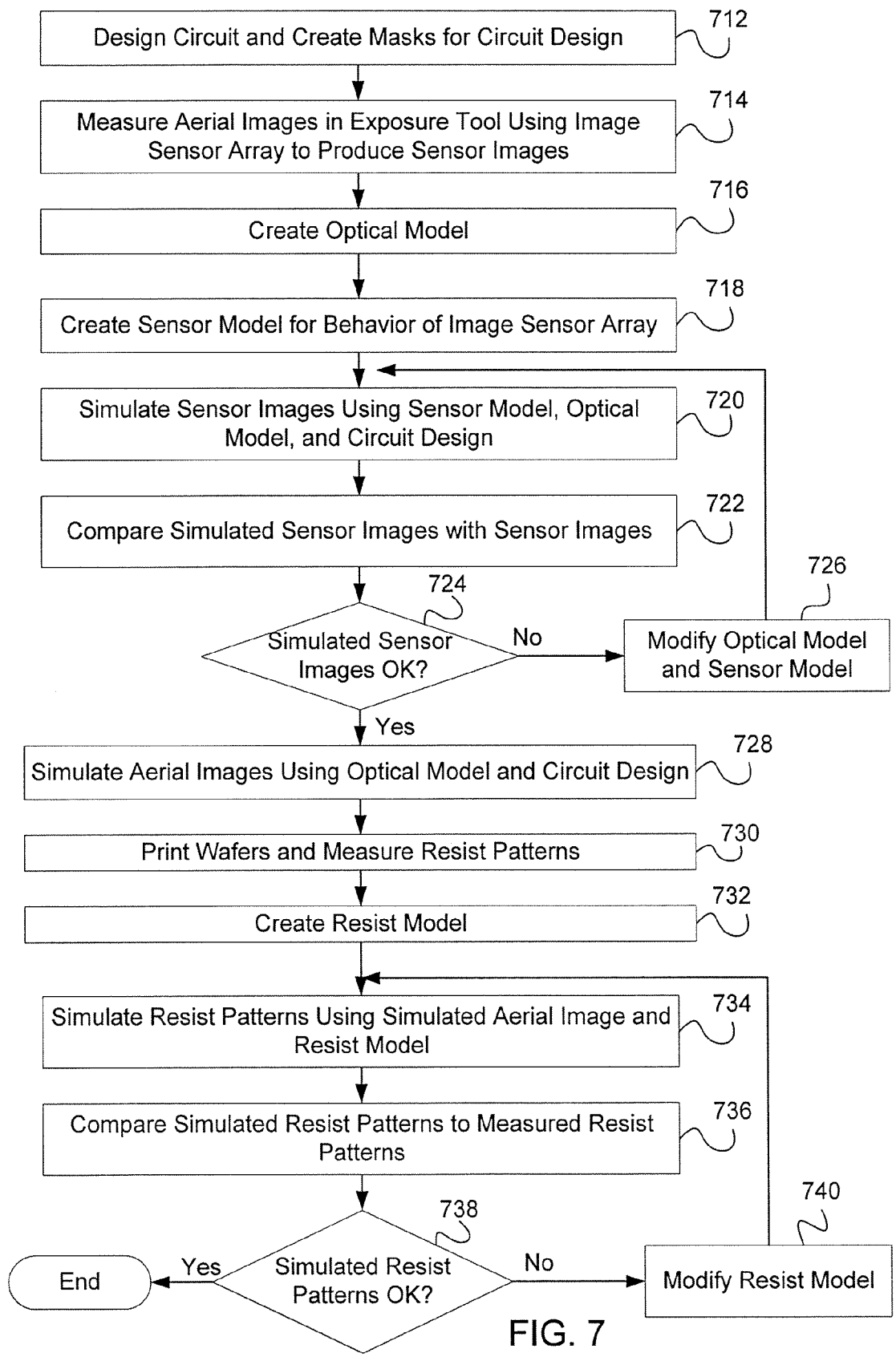
FIG. 7 is a flowchart of method steps for separately calibrating an optical model and a resist model for a lithography process, according to another embodiment of the invention.

In measuring an aerial image using image sensor array 106, one complication is that the aerial image as recorded by image sensor array 106 is not, in fact, exactly the same as the aerial image that is formed on the resist layer of product wafers. As described above, image sensor array 106 may use small apertures 206 having sub-wavelength dimensions over each image sensor element 200 to increase the resolving power of the individual sensor elements 200. The interaction of the incident radiation with apertures 206 generally differs from the interaction of the radiation with a thin dielectric layer, such as photoresist, resulting in certain changes of the perceived image profile at each image sensor element 200. FIG. 7 shows one method to account for such sensor-related effects in the measured aerial images, and still achieve model separability between the optical and resist models as well as correct calibration of the optical model. The method of FIG. 7 includes use of a sensor model that describes the interaction of the incident light with apertures 206 of image sensor array 106. The sensor model can be created from first principles since the physics of the electromagnetic interaction between the incident radiation and the geometry of image sensor array 106 is well known. The sensor model can be further refined by including detailed information on the exact size and shape of apertures 206, or by suitable independent calibration of the sensor response.

FIG. 7 is a flowchart of method steps for calibrating a model of a lithography process including a sensor model, according to another embodiment of the invention. In step 712, a circuit is designed and masks are created for the circuit design. In step 714, an aerial image of the calibration mask is measured in the exposure tool using image sensor array 106 to produce a sensor image. In step 716, an optical model having optical model parameters is created. Then, in step 718, a sensor model for the behavior of image sensor array 106 is created. In step 720, an aerial image as measured by image sensor array 106 is simulated using the sensor model, the optical model, and the circuit design data to produce a simulated sensor image. In step 722, the simulated sensor image is compared to the sensor image and differences between the simulated sensor image and the sensor image are determined. These differences may be quantified as pattern metrics. If the differences are sufficiently great that the simulated sensor image does not sufficiently match the sensor image, in step 726 the optical model is modified by changing the values of the optical model parameters in view of these differences. Step 726 may also include modifying the sensor model. Although this calibration may involve the optimization of two models, it will result in a far more accurate set of optical model parameters than the combined resist model and optical model fitting, since both the optical model and the sensor model are based on well-understood physical principles of optical imaging. In addition, the sensor model can be further optimized independently through the use of calibration tests and direct measurements of physical sensor parameters, such as the aperture geometry. In step 728, an aerial image produced by the exposure tool is simulated using the optimized optical model and the circuit design created in step 712, producing an optimal simulated aerial image. The method of FIG. 7 then continues with steps 730-740, in which the resist model is calibrated.

Figure 8:
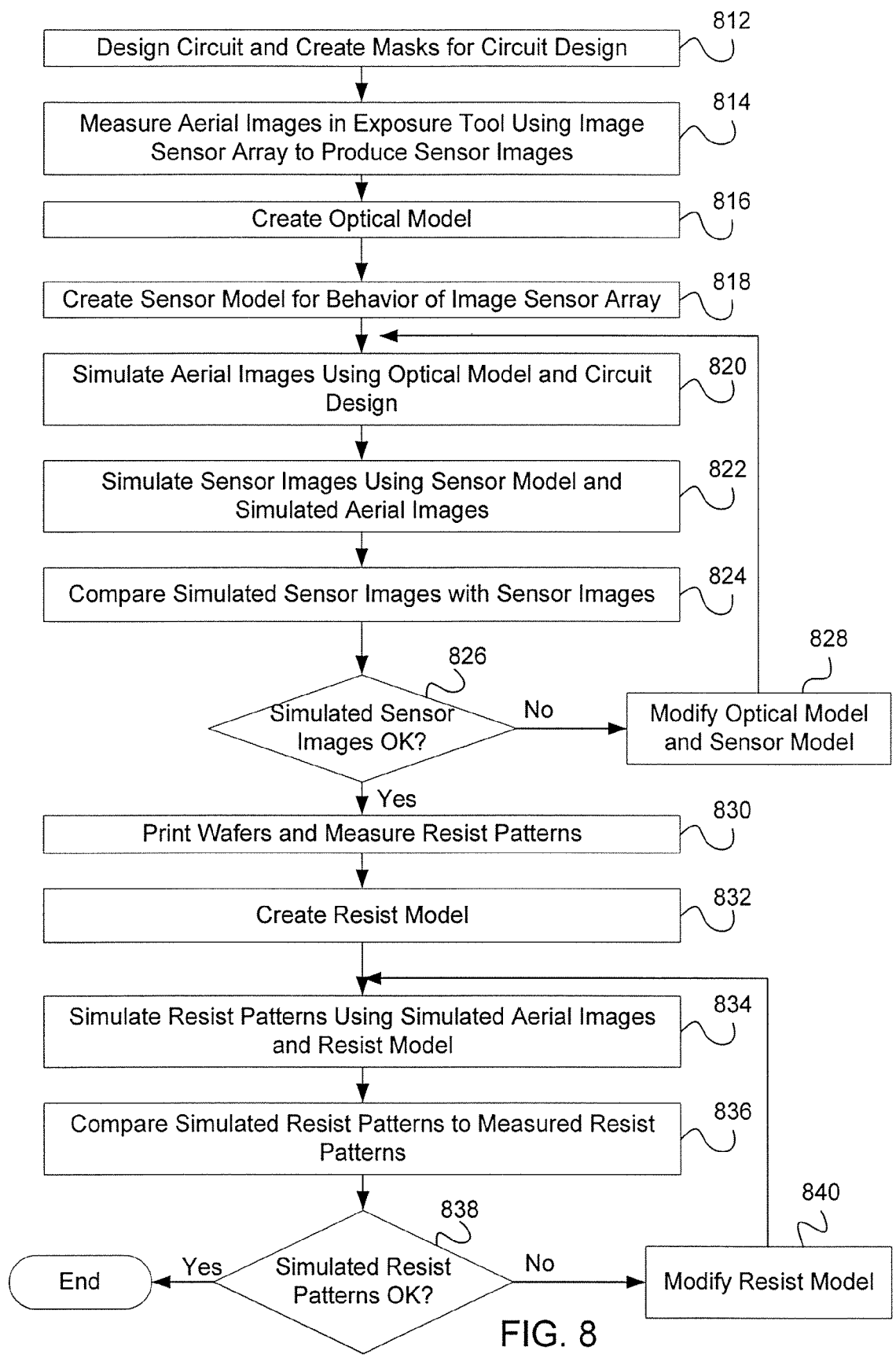
FIG. 8 is a flowchart of method steps for separately calibrating an optical model and a resist model for a lithography process, according to another embodiment of the invention.

Another method of calibrating a model of a lithography process using a sensor model is shown in FIG. 8. In the method of FIG. 8, instead of simulating a sensor image using the optical model, the circuit design data, and the sensor model, in step 822 the sensor image is simulated using simulated aerial images produced in step 820 and the sensor model. The method of FIG. 8 then proceeds as in FIG. 7, resulting in a calibrated optical model, a calibrated sensor model, and a calibrated resist model that provide the closest match between simulations and measurements.

Figure 9:
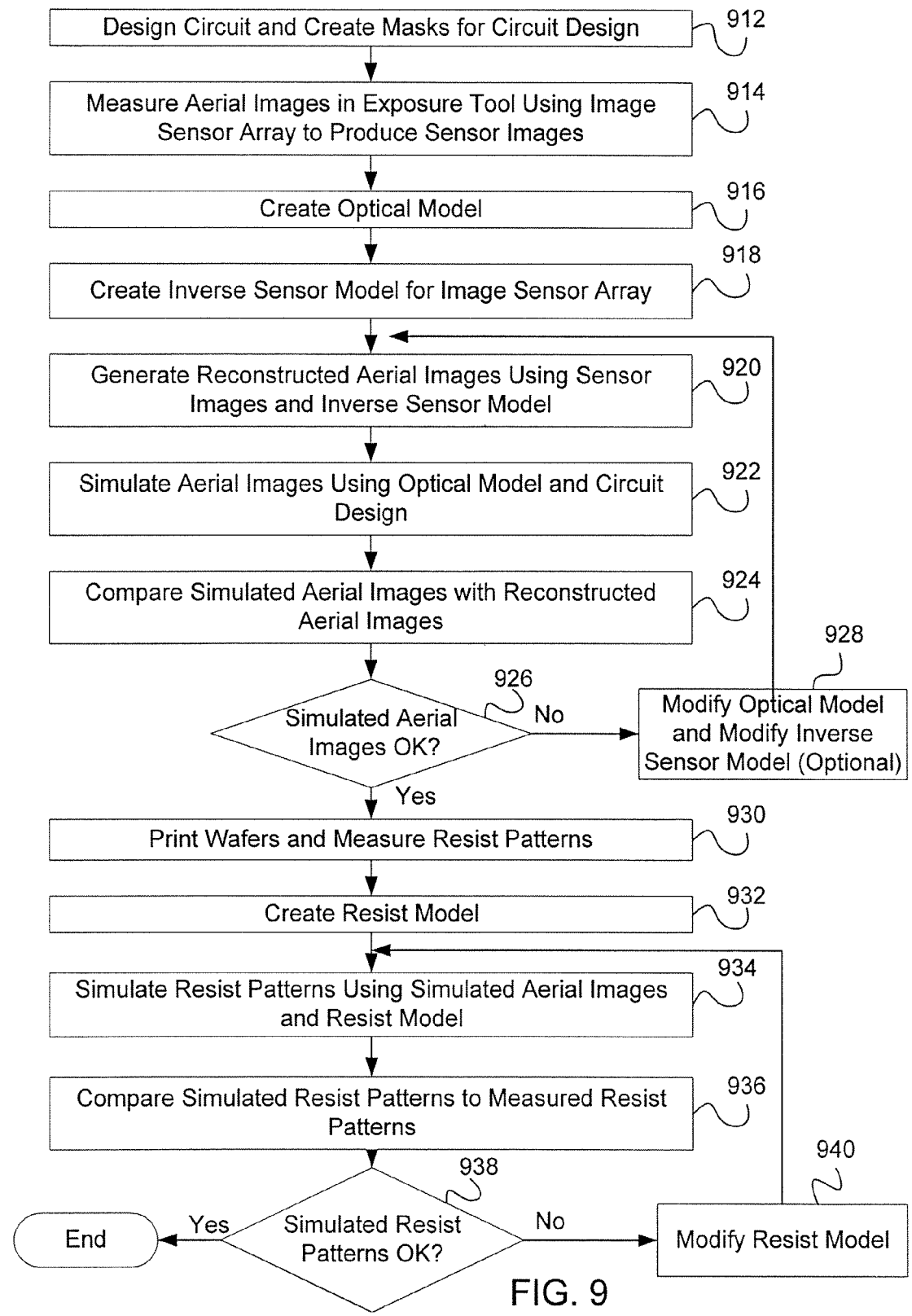
FIG. 9 is a flowchart of method steps for separately calibrating an optical model and a resist model for a lithography process, according to another embodiment of the invention.

Another method of calibrating a model of a lithography process using an inverse sensor model is shown in FIG. 9. In the method of FIG. 9, instead of using a sensor model to simulate a sensor image measured by image sensor array 106, in step 918 an inverse sensor model of image sensor array 106 is created. In step 920, the inverse sensor model mathematically reverts sensor-related artifacts from measured sensor images to provide an accurate representation of the actual light distribution in the exposure tool. The inverse sensor model may use a deconvolution of the sensor effects or other suitable techniques of data processing. The back-calculated aerial images produced using the inverse sensor model are referred to herein as reconstructed aerial images. In step 924, a simulated aerial image produced using the optical model and the circuit design data is compared with the reconstructed aerial image from the measured sensor image, and differences between the simulated aerial image and the reconstructed aerial image are determined. If the differences are sufficiently great that the simulated aerial image does not sufficiently match the reconstructed aerial image, in step 928 the optical model is modified by changing the values of the optical model parameters in view of these differences. Step 928 may also include modifying the inverse sensor model. The method of FIG. 9 then proceeds as in FIG. 7, resulting in a calibrated optical model, a calibrated resist model, and optionally a calibrated inverse sensor model that provide the closest match between simulations and measurements.

Figure 10:
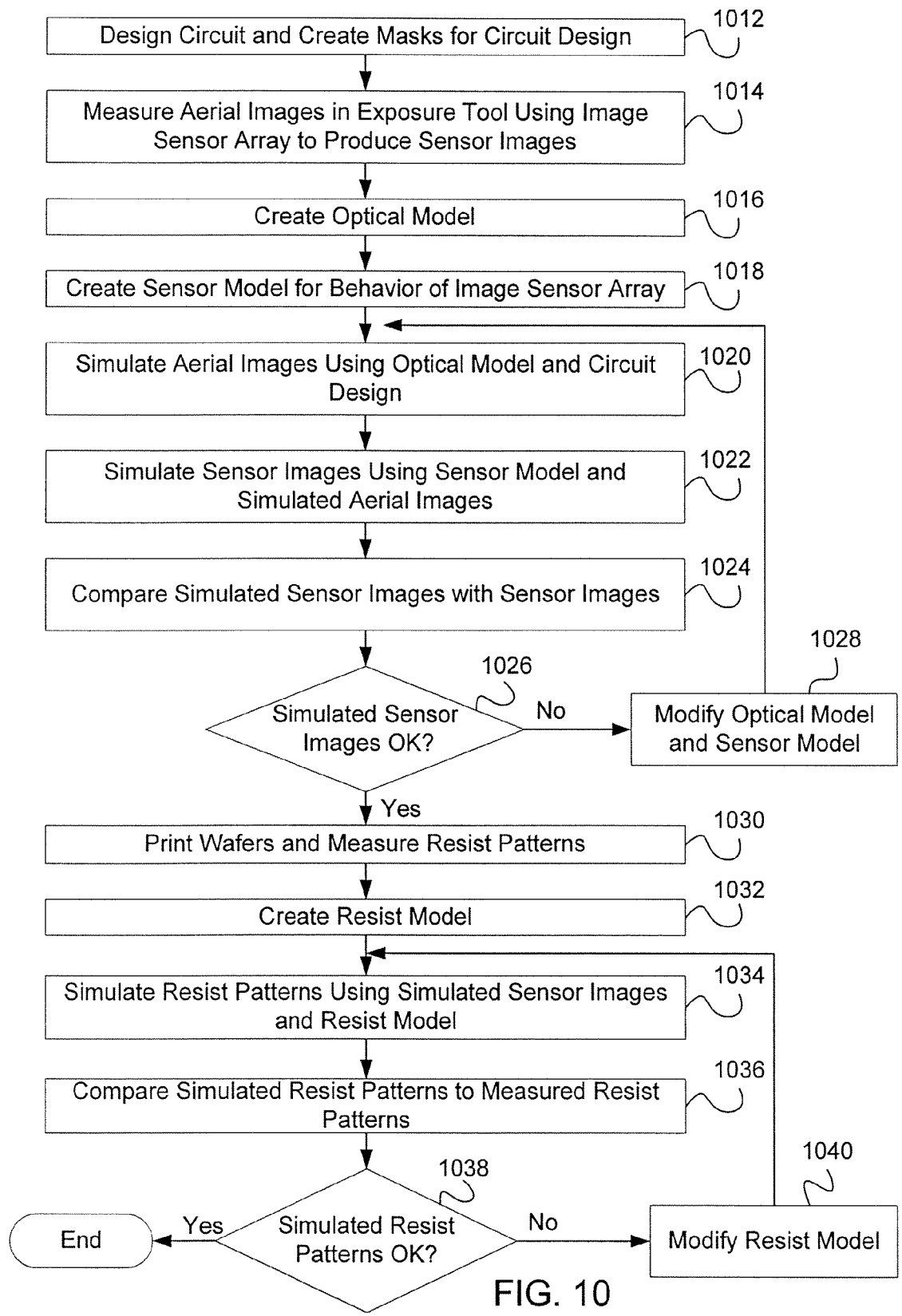
FIG. 10 is a flowchart of method steps for separately calibrating an optical model and a resist model for a lithography process, according to another embodiment of the invention.

Another method of calibrating a model of a lithography process using a sensor model is shown in FIG. 10. The method of FIG. 10 is similar to the method of FIG. 8, except that in step 1034 the resist patterns are simulated using the resist model and the simulated sensor image instead of the simulated aerial image. In the method of FIG. 10, the resist model is actually an "effective resist model" which directly converts sensor images into resist images instead of converting simulated aerial images into resist images. An advantage of the method of FIG. 10 is that later measurements can be made using image sensor array 106 to monitor images formed by any mask pattern, including advanced production masks. The effective resist model calibrated using the sensor image allows for fast and accurate transformation of measured in-situ aerial images to accurate predictions of printed resist patterns. Although such an effective resist model would include certain sensor-related effects, it is superior to previous lumped-parameter models because it still separates the optical components of the wafer exposure tool from the other components of the model. Consequently, separability is maintained for the optical imaging model. If changes are made to the optical parameters of the exposure tool, the effective resist model would not require recalibration, and predictions of resist patterning could be made quickly and accurately based on the in-situ aerial images measured by image sensor array 106. In particular, the method of FIG. 10 allows for reliable prediction of resist pattern printing performance over a range of optical settings, e.g., covering the process window of the pattern design.

Figure 1:
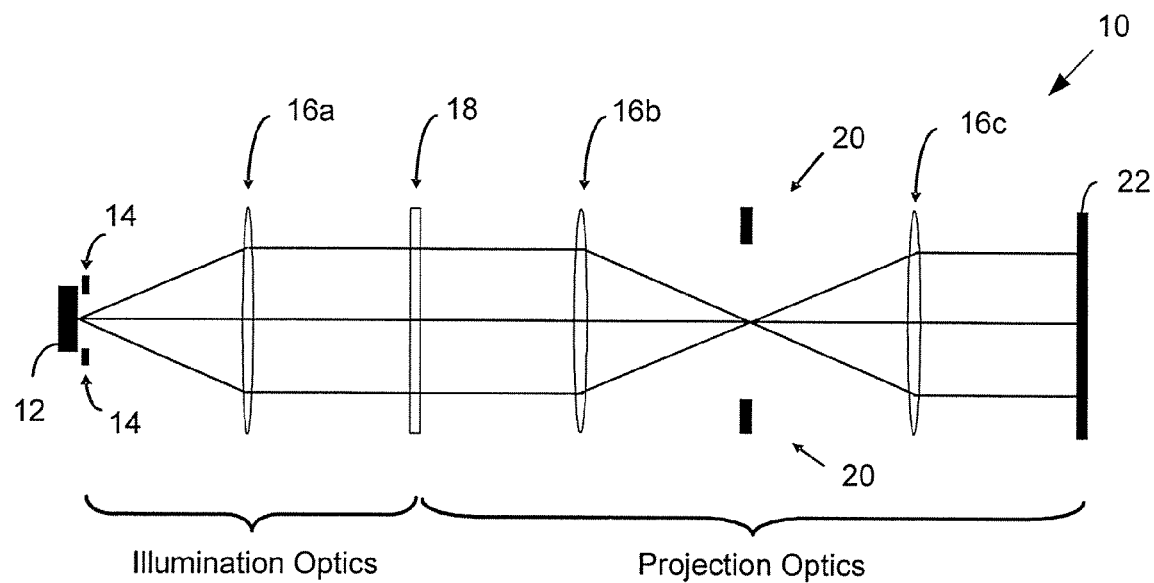
FIG. 1 is a diagram of a prior art embodiment of a lithography exposure tool.
Figure 2:
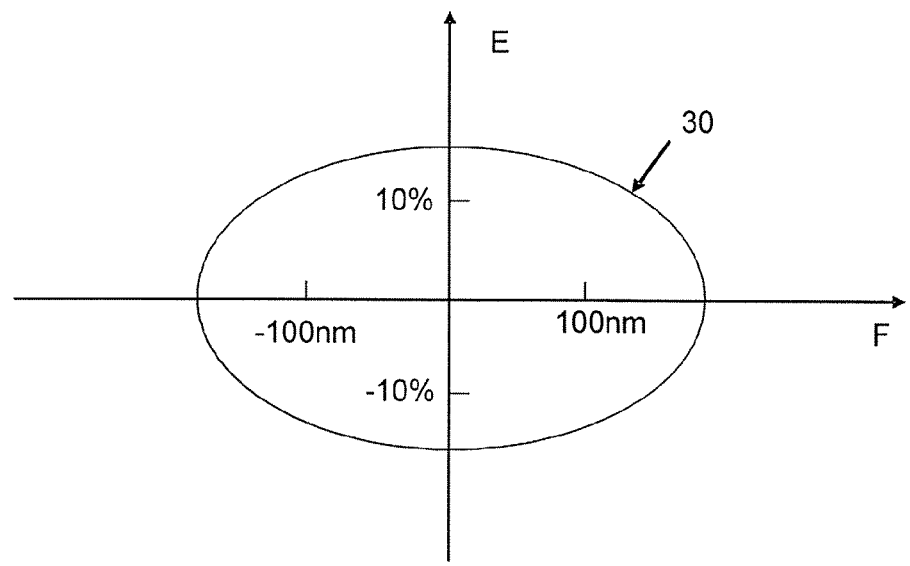
FIG. 2 is a diagram of a prior art embodiment of a process window for a lithography process.
Figure 3:
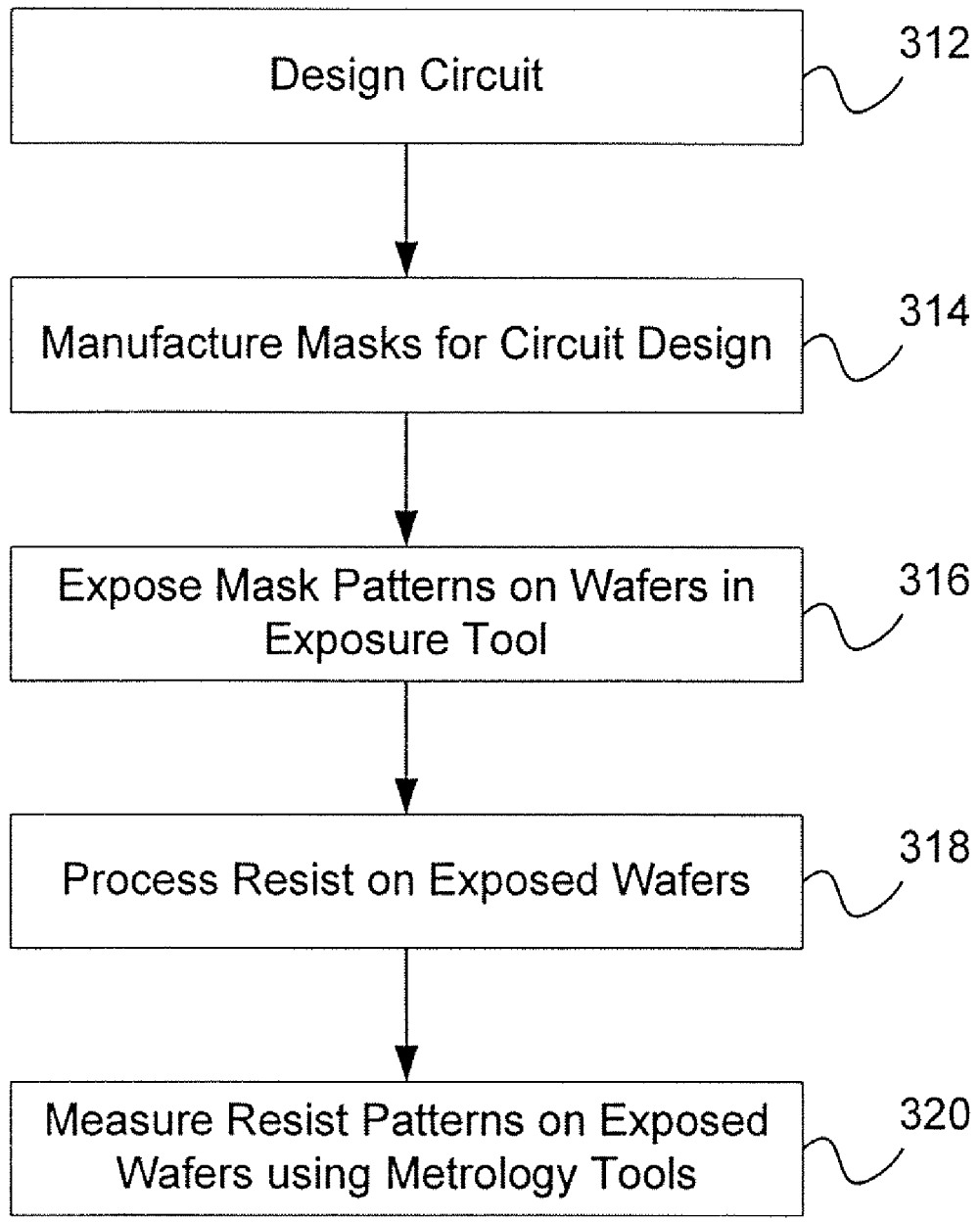
FIG. 3 is a flowchart of a prior art method for creating and measuring resist patterns on a wafer.
Figure 4:
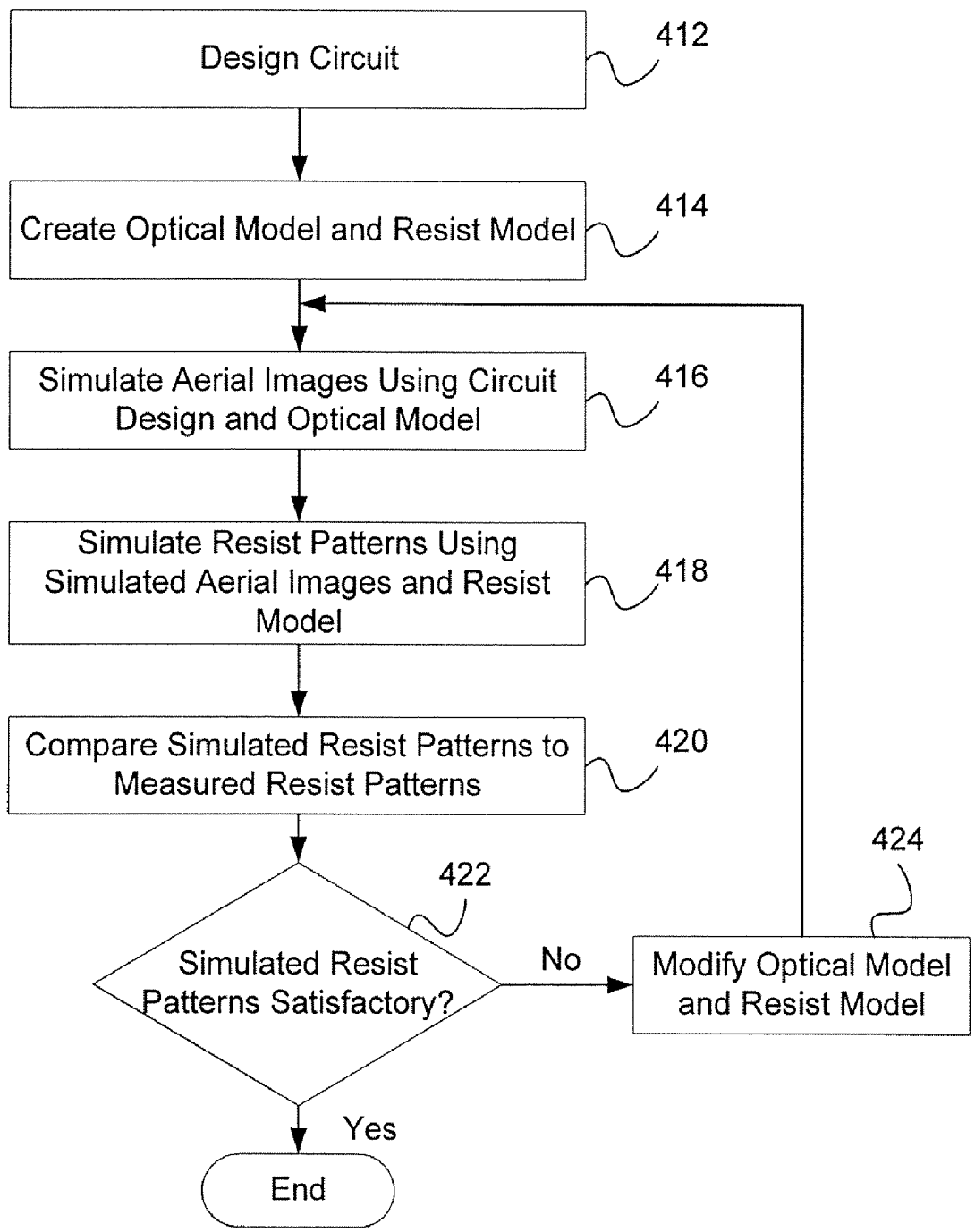
FIG. 4 is a flowchart of a prior art method for calibrating a lithography simulation model.
Figure 11:
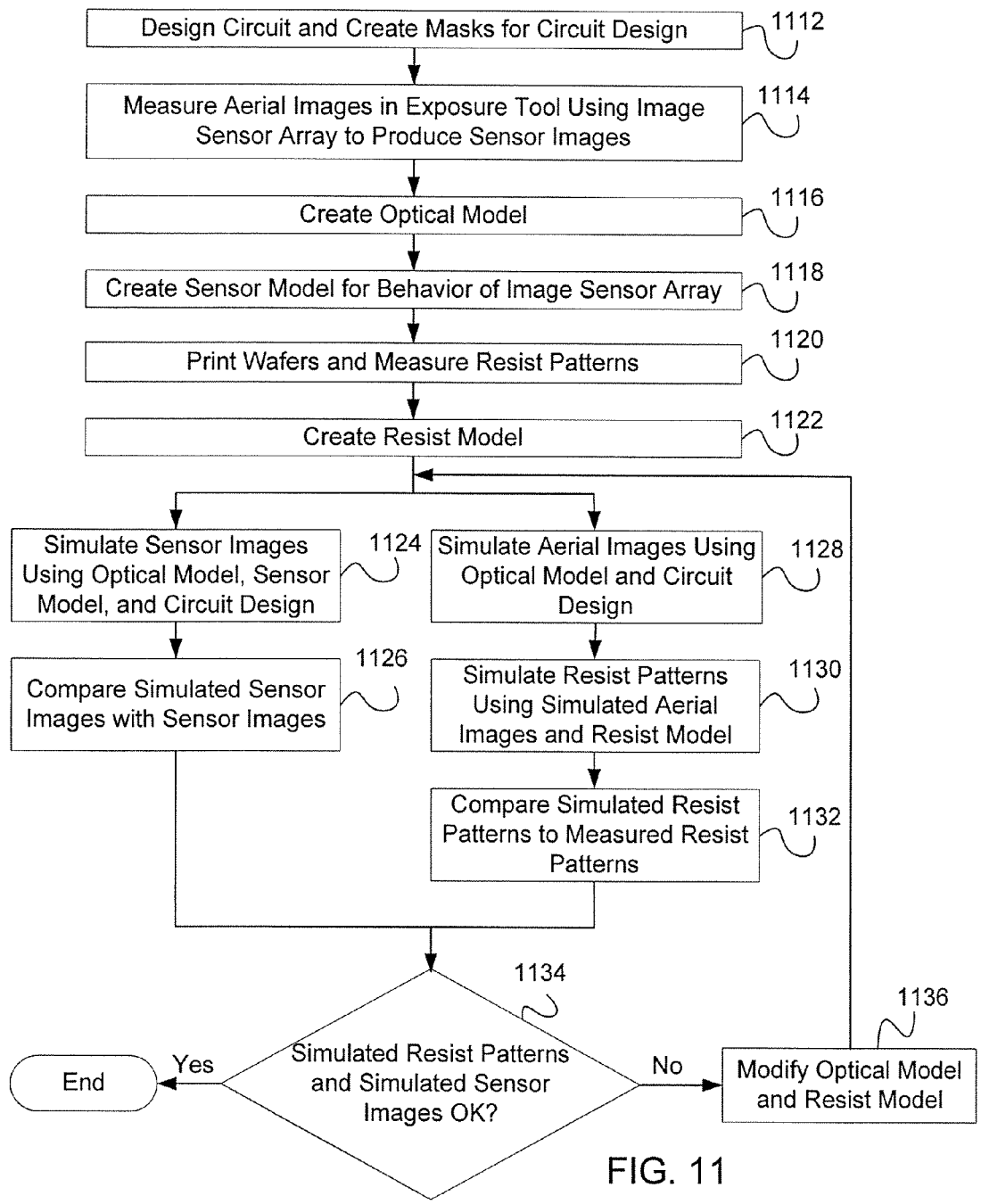
FIG. 11 is a flowchart of method steps for separately calibrating an optical model and a resist model for a lithography process, according to another embodiment of the invention.

While the embodiments described above focus on the separability of the optical model and the resist model, it is recognized that even with these improved calibration methods, full separability of the optical and resist models may not be achievable. In that situation, or for other reasons, it may be beneficial to utilize information from the measured resist patterns to adjust parameters of both the resist model and the optical model. FIG. 11 is a flowchart of method steps for calibrating a model of a lithography process in which information from both resist patterns and sensor images are used to calibrate the optical model. In step 1126, simulated sensor images are compared to sensor images and differences between the images are determined. In step 1132, simulated resist patterns are compared to measured resist patterns and differences between the patterns are determined. Then, in step 1136, the optical model parameters and the resist model parameters are modified based on both the differences between the simulated sensor images and the sensor images and the differences between the simulated resist patterns and the measured resist patterns. This is different from the prior art method shown in FIG. 4, where only the differences between the simulated resist patterns and the measured resist patterns are used to calibrate both the optical and resist models. In the method of FIG. 11 the optical model and the resist model are optimized while both the resist pattern and sensor image differences are minimized simultaneously. In the method of FIG. 11, even if the optical model and resist model are not fully separated within the overall lithography process simulation scheme, the optical model calibration may still receive some of the key benefits of separate calibration and utilize the additional input from sensor image data for restricting the calibration procedure, resulting in a more accurate model with better predictive capability.

The aerial image intensity distribution as measured by image sensor array 106 is an important supplement to the resist pattern measurements from CD-SEM or similar resist metrology used in the traditional method of lithography model calibration. The shortcomings of the traditional approach are especially obvious for two exemplary cases: assist feature printability and resist sidelobe formation. Both phenomena are heavily driven by the intensity of the undesired image modulation, relative to the resist image threshold. (For the typical case of positive photoresist and a bright-field mask, resist residue is formed when the minimum modulation intensity apart from the primary feature drops below the resist image threshold.) Such intensity information is usually absent in the CD-SEM data, because the calibration patterns (including the assist features) are usually designed with care to avoid formation of resist residue at the nominal exposure condition. (In fact, problems related to resist residue are often found much later in the manufacturing process.) To collect such information in the traditional approach would require exposing the test wafer at widely varying process conditions. Even if one took the extra time to collect these data, the results would still depict discrete edge locations only. In contrast, the sensor images capture two-dimensional (x and y) or three-dimensional (x, y, and defocus) intensity information in a straightforward fashion. The image intensity may be interpolated to arbitrary, continuous spatial locations, which provide a much stronger anchoring for the optical model.

Another problem encountered in model calibration is underfitting, i.e., there may be systematic trends in the final model calibration error (model-fitted (simulated) CD minus measured CD). For example, the fitting results for line-end pull-back may exhibit a systematic dependency with pitch, although the results for line-space patterns may be satisfactory. In the traditional approach, it is very difficult to improve the fitting in such cases, because it is not clear whether the cause of the misfit is in the optical part or the resist part of the resultant model. This situation has an easy remedy when the sensor images are available as an independent measurement of the imaging system: one could try to find whether the same systematic trend exists in the comparison of simulated sensor images and measured sensor images, and immediately determine whether the error is in the optical model. If indeed the optical model is found to be in need of improvement, the sensor images would likely offer further and more specific guidance (e.g., calibrating the optical aberrations or flare).

In another aspect of the invention, particular calibration patterns are used for the optical model calibration that allow for the extraction or fitting of specific parameters of the projection optics, such as specific aberrations or other impairments of the optical system. Typically, relatively simple calibration patterns are used in current lithography model calibration methods, such as line-space patterns with varying pitch or line-end structures. On the other hand, it is known from the literature (see U.S. Pat. No. 6,787,789 to Van Der Laan) that certain particular calibration patterns can be defined that are particularly sensitive to specific aberrations, and that measurement of changes to the projected pattern shapes through focus can in fact be used to determine the values of aberrations (e.g., expressed as Zernike coefficients) by a fitting procedure.

In lithography model calibration, optical aberrations are normally not taken into account, i.e., are not varied and fitted in the calibration process, because it is difficult to sufficiently constrain the fitting procedure for a large set of parameters. Optical aberrations may be taken into account in lithography as independently measured values that can be provided by the exposure tool manufacturers or measured by optical interferometric methods or separate diagnostics tools such as the Litel test reticle or the ASML ILIAS system. Typically, these methods take several hours to run and are therefore not often used on a regular basis for production exposure tools. It is noted, however, that aberrations of the optical system are not static, but change gradually over the lifetime of the exposure tool due to various drifts, lens heating and aging, etc.

One particular characteristic of image sensor array 106 is the ability to generate very large amounts of data in a very short time; millions of aerial image samples may be recorded within a few minutes. One particular implementation of any of the methods of FIGS. 6-11 would make beneficial use of the ability of image sensor array 106 to provide large datasets, and utilize specific aberration calibration patterns on a calibration mask, in addition to the typical resist calibration patterns. In addition, a fitting routine would be included to determine the values of optical aberrations as input to the model of the lithography process. This aberration fitting routine may be performed separately, in parallel to the other optical model calibration procedure, or be an integral part of it.

Particular calibration patterns may include horizontal vs. vertical line patterns and positive vs. negative 45 degree patterns, which may be measured through defocus variations to specifically detect astigmatism, e.g., by CD differences and/or differences in best focus between patterns of different orientation. Line pairs may be used to detect the effect of comma as an asymmetry between left and right in vertical pairs or between top and bottom in horizontal line pairs, either by linewidth measurements or other measured sensor image parameters. Measurements of line/space patterns through pitch and through focus may be utilized to determine spherical aberration, which is associated with pitch-dependent focus shifts, while hexagonal or brick wall patterns will be sensitive to tri-foil aberration. Besides these few examples, more complex patterns can be defined or found by simulation and sensitivity analysis. Other specific tests, including optimized test patterns, specific analysis routines or fitting procedures may also be included in order to address other specific impairments of significance to the lithography process performance. These may include characterization of long-range scattering or stray light (also known as flare), mid-spatial frequency scattering, polarization, or other effects that affect the quality of the image formation in the exposure tool.

For advanced lithography technology nodes (e.g., 65 nm and 45 nm), mask topography effects are becoming increasingly prominent, due to the shrinking feature size. Rigorous simulation of the three-dimensional light-scattering by the mask is extremely slow, and various approximate methods have been developed (see "Simplified Models for Edge Transitions in Rigorous Mask Modeling," K. Adam, A. R. Neureuther, Proc. SPIE, Vol. 4346, pp. 331-334 (2001); "Efficient and Rigorous Three-Dimensional Model for Lithography Simulation," K. D. Lucas et al., J. Opt. Soc. Am. A Vol. 13, pg. 2187 (1996). Such approximate methods are much faster than the rigorous simulations, but their accuracy can only be verified on a very limited set of test structures. In fact, such methods have often been developed based on observations drawn from the rigorous simulation results obtained with such a limited test set. In addition, even the results of the rigorous simulations are of questionable utility, because the exact topography required as simulation input (e.g., edge placement bias, sidewall angle, and overhang) is either unknown, difficult to obtain, or hard to model faithfully. In the traditional approach, one would have to rely on the comparison of predicted vs. measured CDs to validate the simulation methodology. Again due to the lack of direct information on the aerial image, such validation may itself be vulnerable to the separability issue. The measured aerial image data (sensor images) fill this gap naturally. In this embodiment, the method of the invention moves beyond the anchoring of model parameter values, and in fact helps discriminate, validate, or improve the competing algorithmic frameworks and methodologies for simulation of mask topography effects, based on experimental data.

The lithography model calibration methods described herein are beneficially utilized in the full-chip simulation system described in U.S. Pat. No. 7,003,758. The improvements in model robustness achieved by separable lithography model components and separate calibration of the optical model and the resist model will provide more accurate and predictive full chip product simulations, in particular under variation of optical parameters across a process window. This combination of a separable model based on the unique intermediate step of calibrating the optical model to measured aerial images working together with a full chip simulation system using an independently calibrated resist model provides a simulation capability previously unavailable to the lithography community.

Figure 12:
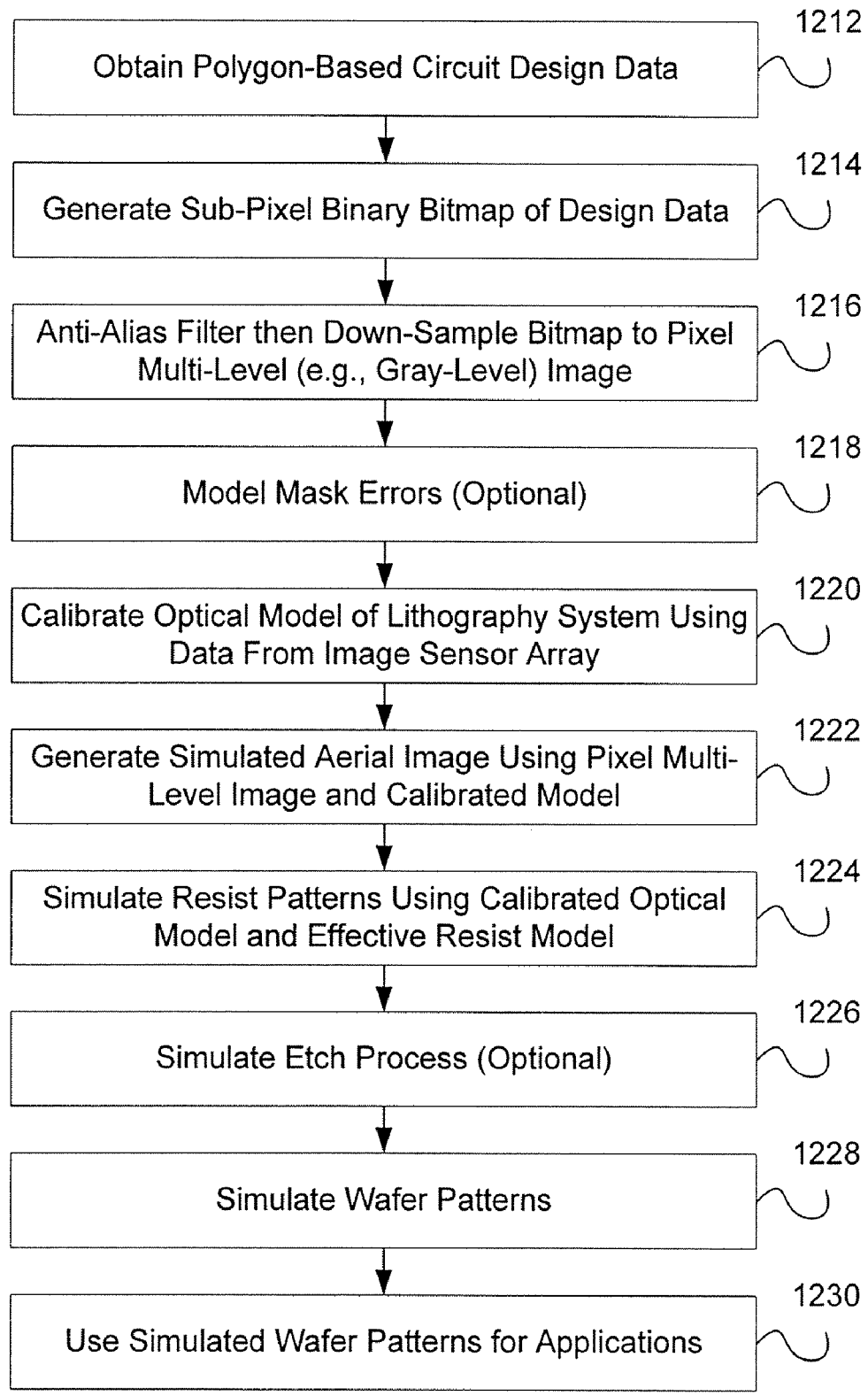
FIG. 12 is a flowchart of method steps for simulating a lithography process, according to one embodiment of the invention.

FIG. 12 is a flowchart of method steps for full circuit lithography simulation, according to one embodiment of the invention. In step 1212, polygon-based design data for the circuit to be simulated is obtained from a circuit designer. In step 1214, a sub-pixel binary bitmap of the circuit is created using the polygon-based design data. In step 1216, the sub-pixel binary bitmap is anti-alias filtered and down-sampled to produce a pixel-sized multi-level image, such as a pixel-sized grey-level image, that is representative of a mask for the circuit. Any techniques for converting the polygon-based design data to a pixel-sized multi-level image are within the scope of the invention. In optional step 1218, systematic mask errors are modeled. Common mask errors include bias and corner rounding.

In step 1220, an optical model for the exposure tool is calibrated using an image sensor array in accordance with any one of the methods of FIGS. 6-11. In step 1222, simulated aerial images are created using the pixel-sized multi-level image and the calibrated optical model. The aerial image simulation may be implemented by the lithography simulation system discussed below in conjunction with FIG. 13. In step 1224, resist patterns are simulated using the calibrated optical model and an effective resist model. The resist pattern simulation may be implemented by the lithography simulation system of FIG. 13. In optional step 1226, the etch process for etching the patterns into the substrate is simulated. In step 1228, the printed wafer patterns are simulated by compiling the simulated resist patterns. Then, in step 1230, the simulated wafer patterns are used for various applications, for example, comparing the simulated wafers patterns to the design target, verifying that RET designs produce the intended effects, determining overly margin, and analyzing the wafer pattern's sensitivity to process variations.

Figure 13:
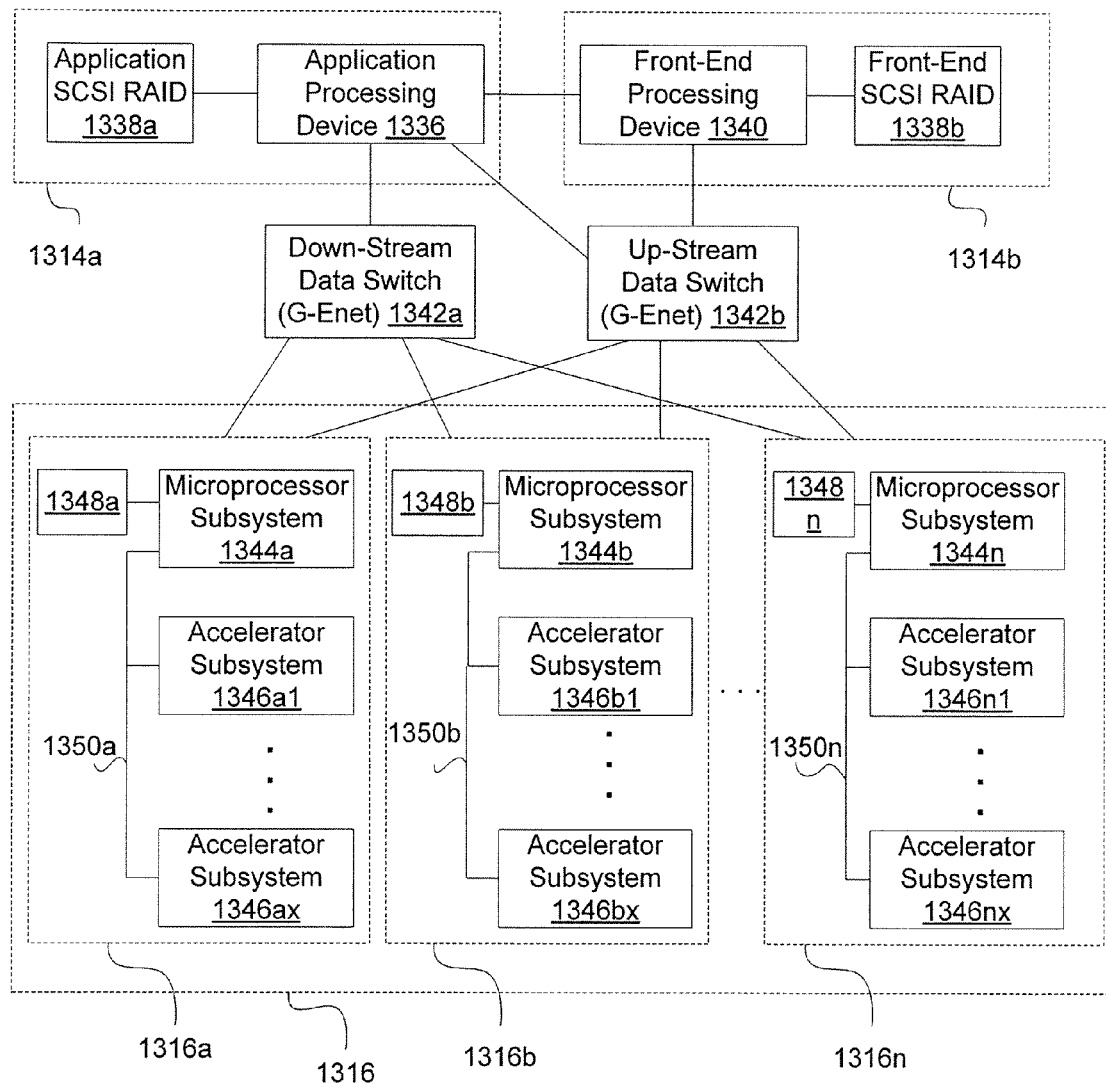
FIG. 13 is a diagram of one embodiment of a lithography simulation system, according to the invention.

FIG. 13 is a diagram of one embodiment of a lithography simulation system 1300, according to the invention. System 1300 includes, but is not limited to, one or more general purpose-type computing systems, including but not limited to, an application processing system 1314a and a front-end processing system 1314b. Application processing system 1314a is suitably configured to handle job management of the overall operations of system 1300. In particular, in one embodiment, application processing system 1314a includes an application processing device 1336 and an application SCSI RAID 1338a. Application processing device 1336 is suitably programmed to provide management of the operations of the various components of system 1300. In this regard, for example, application processing device 1336 may be programmed to partition a design database for the various components of an accelerator system 1316, thereby specifying the individual jobs, functions or processes performed by components of accelerator system 1316. Application SCSI RAID hard-disk array 1338a provides storage for the programs and data (for example, design database) used by application processing device 1336.

Front-end processing system 1314b includes a front-end processing device 1340 which is suitably programmed to handle or perform direct interaction with the user or operator (i.e., the "outside world") via, for example, client computer(s) (not illustrated) that provide operator or user access to system 1300 for job setup and/or results review/analysis. A front-end SCSI RAID hard-disk array 1338b, associated with front-end processing device 1340 should be a high capacity storage device, since front-end SCSI RAID 1338b is used to store results and images of many simulation jobs. Front-end processing system 1314b also communicates with application processing system 1314a, to provide or retrieve data to or from application SCSI RAID 1338a (for example, the design database), and instructs application processing system 1314a to start a job, as instructed by the user or operator.

Application processing system 1314a and front-end processing system 1314b connect with accelerator system 1316, for example, through high speed switches (for example, gigabit-Ethernet switches 1342a and 1342b). Switches 1342a and 1342b may be Dell 5224 Power Connect, manufactured and provided by Dell Computer (Austin, Tex., USA). The implementation and operation of the Dell 5224 Power Connect are described in detail in application notes, technical/journal articles and data sheets, all of which are incorporated by reference herein.

In one embodiment, all or substantially all of the actual computationally intensive tasks of lithography simulation may be conducted by accelerator system 1316, and, in particular, one or more accelerator components 1316a-n. This architecture allows scalable computation capacity, by changing the number of accelerator hardware components 1316a-n. Moreover, this architecture also enables or enhances overall fault-tolerance of system 1300. For example, should a given accelerator hardware component 1316a-n fail, its jobs may be re-assigned to the other accelerator hardware components 1316*a-n*, and, in this way, system 1300 maintains its operational condition/state.

In particular, accelerator system 1316 may include one or more accelerator components 1316*a-n*, each having one of more microprocessor subsystem 1344*a-n* (including one or more microprocessors), one or more accelerator subsystems 1346*a-n*, and local or resident memory storage 1348*a-n* coupled to an associated microprocessor subsystem 1344*a-n*. The extent or amount of hardware acceleration capability may be balanced with microprocessor subsystems 1344*a-n*, depending on the extent or amount of computation to be performed.

In one embodiment, microprocessor subsystems 1344*a-n* each includes two Xeon microprocessors manufactured by Intel (Santa Clara, Calif., USA). The accelerator subsystems 1346*a-n* each includes a plurality of Application-Specific Integrated Circuit (ASIC), special-purpose DSP integrated circuits, and/or programmable gate arrays (for example, field-programmable gate arrays ("FPGAs")). In fact, each of accelerator subsystems 1346*a-n* may include multiple accelerator subsystems, for example, accelerator subsystem 1346*a* may include all the accelerator subsystems 1346*a*1-6*ax*, as illustrated in FIG. 13. In this way, when fully utilized, each of accelerator subsystems 1346*a-n* contains computational capacity of roughly twenty-five Xeon microprocessors.

A bus 1350*a-n* facilitates high-speed communication between microprocessor subsystem 1344*a-n* and associated accelerator subsystem(s) 1346*a-n*. The communication protocols and techniques on bus 1350*a-n* may be PCI, PCIX, or other high-speed communication protocols and techniques. Indeed, any high-speed technique, whether now known or later developed, may be implemented over bus 1350*a-n*. Notably, in one embodiment, the bus interface may be implemented using a 21P100BGC PCI-X bridge (64 bit/133 MHz) from International Business Machines Corporation (Armonk, N.Y., USA). The implementation and operation of the 21 P100BGC are described in detail in application notes, technical/journal articles and data sheets, all of which are incorporated by reference herein.

In one embodiment, computations that are performed by be accelerator subsystems 1346*a-n* include, for example, anti-aliasing filtering and down-sampling, Fast Fourier Transforms for aerial image computation, image filtering and/or thresholding operations in resist modeling. The computations that are performed by microprocessor subsystems 1344*a-n* include, for example, polygon-to-binary bitmap conversion and application programs or processes (e.g., RET verification). The partitioning of computing tasks between microprocessor subsystem 1344*a-n* and accelerator subsystems 1346*a-n* is application-dependent and may vary from application to application or job to job.

It should be noted that each of the methods of FIGS. 6-11 include modifying models to achieve an optimum fit between simulated and experimental data sets. The specifics of the model modification procedure can take any number of algorithmic approaches, such as minimizing the sum of the squares of the errors, removing outliers (fliers), minimizing the maximum residual error, using weighting factors to preferentially fit specific points, regions, metrics, or optical conditions, and other methods which are well known in the art. It is to be understood that the methods of model calibration disclosed herein may include any such mathematical formalism for matching simulated and measured results.

It should also be understood that while many of the methods of the invention described herein mention the apertures of image sensor array 106 as a key element in the sensor model, the methods of the invention are not restricted to an in-situ image sensor array employing such apertures, and may be generalized to any in-situ image sensor capable of collecting aerial images independent of a resist model. The sensor may also be modified to operate in an immersion lithography system, an e-beam lithography system, or any lithography system in which a wafer-like sensor unit can be substituted in place of an actual production wafer for exposure to the imaging pattern of the exposure tool.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A method for lithography model calibration, comprising:

selecting a model for a lithography process, the model including an optical model and a resist model, the optical model having initial values of optical model parameters and the resist model having initial values of resist model parameters;

measuring an aerial image using an image sensor array to produce a measured sensor image, the aerial image being produced by a lithography tool from a mask created using circuit design data;

simulating the lithography process using the optical model and the circuit design data to produce a simulated aerial image;

determining differences between the simulated aerial image and the measured sensor image; and modifying the values of the optical model parameters based on the differences between the simulated aerial image and the measured sensor image to identify optimal values for the optical model parameters, wherein a simulated aerial image produced using the optimal values for the optical model parameters is an optimal simulated aerial image that is a best match for the measured sensor image.

2. The method of claim 1, further comprising:

processing a wafer using the lithography process and the mask to produce printed resist patterns;

measuring the printed resist patterns to produce measured resist patterns;

simulating formation of resist patterns on a wafer using the resist model and the optimal simulated aerial image to produce simulated resist patterns;

determining differences between the simulated resist patterns and the measured resist patterns; and modifying the values of the resist model parameters based on the differences between the simulated resist patterns and the measured resist patterns to identify optimal values for the resist model parameters, wherein simulated resist patterns produced using the optimal values for the resist model parameters are optimal simulated resist patterns that are a best match for the measured resist patterns.

3. The method of claim 2, wherein the optimal values for the resist model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

4. The method of claim 2, wherein the differences between the simulated resist patterns and the measured resist patterns include one or more values of critical dimension, resist thickness, sidewall angle, resist profile, footing, and top-profile rounding.

5. The method of claim 1, wherein the optimal values for the optical model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

6. The method of claim 1, wherein the differences between the simulated aerial image and the measured sensor image include one or more values of image intensity, image slope, image contrast, critical dimension, line-end pullback, and corner rounding.

7. The method of claim 1, wherein the image sensor array is disposed in an image sensor unit that is capable of being loaded into the wafer stage of an exposure tool.

8. The method of claim 1, wherein the image sensor array is disposed in an image sensor unit that is integrated into an exposure tool.

9. The method of claim 1, wherein the circuit design data are a set of calibration patterns.

10. The method of claim 9, wherein the set of calibration patterns includes patterns covering a wide area of a pattern parameter space that are sensitive to process variations.

11. The method of claim 10, wherein the patterns have varying values of size and pitch.

12. The method of claim 9, wherein the set of calibration patterns includes line-space patterns, contacts, line-ends, and brick wall patterns.

13. The method of claim 9, wherein the set of calibration patterns includes line-space patterns with varying values of orientation, hexagonal patterns, or brick wall patterns for optimal calibration of optical aberration parameters.

14. The method of claim 1, wherein simulating the lithography process and measuring the aerial image are performed for a range of patterns, process window conditions, and optical conditions.

15. The method of claim 14, wherein the range of patterns includes one or more of line-space patterns with varying pitch and line-end patterns.

16. The method of claim 14, wherein the process window conditions include one or more varying values of focus and exposure dose.

17. The method of claim 14, wherein the optical conditions include one or more varying values of numerical aperture and partial coherence.

18. A method for calibrating a model of a lithography process, comprising:
selecting a model for a lithography process, the model including an optical model and a resist model, the optical model having initial values of optical model parameters;
selecting a sensor model for an image sensor array, the sensor model having initial values of sensor model parameters;
measuring an aerial image using the image sensor array to produce a measured sensor image, the aerial image being produced by a lithography tool from a mask created using circuit design data;
simulating behavior of the image sensor array using the optical model, the sensor model, and the circuit design data to produce a simulated sensor image;
determining differences between the measured sensor image and the simulated sensor image; and
modifying the optical model parameters and the sensor model parameters based on the differences between the measured sensor image and the simulated sensor image to identify optimal values for the optical model parameters and optimal values for the sensor model parameters, wherein a simulated sensor image produced using the optimal values for the optical model parameters and the optimal values for the sensor model parameters is an optimal simulated sensor image that is a best match for the measured sensor image.

19. The method of claim 18, further comprising:
processing a wafer using the lithography process and the mask to produce printed resist patterns;
measuring the printed resist patterns to produce measured resist patterns;
simulating the lithography process using the optical model with the optimal optical model parameters to produce an optimal simulated aerial image;
simulating formation of resist patterns on a wafer using the resist model and the optimal simulated aerial image to produce simulated resist patterns;
determining differences between the simulated resist patterns and the measured resist patterns; and
modifying the values of the resist model parameters based on the differences between the simulated resist patterns and the measured resist patterns to identify optimal values for the resist model parameters, wherein simulated resist patterns produced using the optimal values for the resist model parameters are optimal simulated resist patterns that are a best match for the measured resist patterns.

20. The method of claim 19, wherein the optimal values for the resist model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

21. The method of claim 19, wherein the differences between the simulated resist patterns and the measured resist patterns include one or more values of critical dimension, resist thickness, sidewall angle, resist profile, footing, and top-profile rounding.

22. The method of claim 18, wherein the optimal values for the optical model parameters and the optimal values for the sensor model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

23. The method of claim 18, wherein the differences between the measured sensor image and the simulated sensor image include one or more values of image intensity, image slope, image contrast, critical dimension, line-end pullback, and corner rounding.

24. The method of claim 18, wherein the image sensor array is disposed in an image sensor unit that is capable of being loaded into the wafer stage of an exposure tool.

25. The method of claim 18, wherein the image sensor array is disposed in an image sensor unit integrated into an exposure tool.

26. The method of claim 18, wherein the circuit design data are a set of calibration patterns.

27. The method of claim 26, wherein the set of calibration patterns includes patterns covering a wide area of a pattern parameter space that are sensitive to process variations.

28. The method of claim 27, wherein the patterns have varying values of size and pitch.

29. The method of claim 26, wherein the set of calibration patterns includes line-space patterns, contacts, line-ends, and brick wall patterns.

30. The method of claim 26, wherein the set of calibration patterns includes line-space patterns with varying values of orientation, hexagonal patterns, or brick wall patterns for optimal calibration of optical aberration parameters.

31. The method of claim 18, wherein simulating behavior of the image sensor array and measuring the aerial image are performed for a range of patterns, process window conditions, and optical conditions.

32. The method of claim 31, wherein the range of patterns includes one or more of line-space patterns with varying pitch and line-end patterns.

33. The method of claim 31, wherein the process window conditions include one or more varying values of focus and exposure dose.

34. The method of claim 31, wherein the optical conditions include one or more varying values of numerical aperture and partial coherence.

35. A method for calibrating a model of a lithography process, comprising:
selecting a model for a lithography process, the model including an optical model and a resist model, the optical model having initial values of optical model parameters;
selecting a sensor model for an image sensor array, the sensor model having initial values of sensor model parameters;
measuring an aerial image using the image sensor array to produce a measured sensor image, the aerial image being produced by a lithography tool from a mask created using circuit design data;
simulating the lithography process using the optical model and the circuit design data to produce a simulated aerial image;
simulating behavior of the image sensor array using the simulated aerial image and the sensor model to produce a simulated sensor image;
determining differences between the measured sensor image and the simulated sensor image; and
modifying the optical model parameters and the sensor model parameters based on the differences between the measured sensor image and the simulated sensor image to identify optimal values for the optical model parameters and optimal values for the sensor model parameters, wherein a simulated sensor image produced using the optimal values for the optical model parameters and the optimal values for the sensor model parameters is an optimal simulated sensor image that is a best match for the measured sensor image.

36. The method of claim 35, further comprising:
processing a wafer using the lithography process and the mask to produce printed resist patterns;
measuring the printed resist patterns to produce measured resist patterns;
simulating the lithography process using the optical model with the optimal optical model parameters to produce an optimal simulated aerial image;
simulating formation of resist patterns on a wafer using the resist model and the optimal simulated aerial image to produce simulated resist patterns;
determining differences between the simulated resist patterns and the measured resist patterns; and
modifying values of resist model parameters of the resist model based on the differences between the simulated resist patterns and the measured resist patterns to identify optimal values for the resist model parameters, wherein simulated resist patterns produced using the optimal values for the resist model parameters are optimal simulated resist patterns that are a best match for the measured resist patterns.

37. The method of claim 36, wherein the optimal values for the resist model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

38. The method of claim 36, wherein the differences between the simulated resist patterns and the measured resist patterns include one or more values of critical dimension, resist thickness, sidewall angle, resist profile, footing, and top-profile rounding.

39. The method of claim 35, further comprising:
processing a wafer using the lithography process and the mask to produce printed resist patterns;
measuring the printed resist patterns to produce measured resist patterns;
simulating formation of resist patterns on a wafer using the resist model and the optimal simulated sensor image to produce simulated resist patterns;
determining differences between the simulated resist patterns and the measured resist patterns; and
modifying values of resist model parameters of the resist model based on the differences between the simulated resist patterns and the measured resist patterns to identify optimal values for the resist model parameters, wherein simulated resist patterns produced using the optimal values for the resist model parameters are optimal simulated resist patterns that are a best match for the measured resist patterns.

40. The method of claim 39, wherein the optimal values for the resist model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

41. The method of claim 39, wherein the differences between the simulated resist patterns and the measured resist patterns include one or more values of critical dimension, resist thickness, sidewall angle, resist profile, footing, and top-profile rounding.

42. The method of claim 35, wherein the optimal values for the optical model parameters and the optimal values for the sensor model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

43. The method of claim 35, wherein the differences between the simulated aerial image and the measured sensor image include one or more values of image intensity, image slope, image contrast, critical dimension, line-end pullback, and corner rounding.

44. The method of claim 35, wherein the image sensor array is disposed in an image sensor unit that is capable of being loaded into the wafer stage of an exposure tool.

45. The method of claim 35, wherein the image sensor array is disposed in an image sensor unit integrated into an exposure tool.

46. The method of claim 35, wherein the circuit design data are a set of calibration patterns.

47. The method of claim 46, wherein the set of calibration patterns includes patterns covering a wide area of a pattern parameter space that are sensitive to process variations.

48. The method of claim 47, wherein the patterns have varying values of size and pitch.

49. The method of claim 46, wherein the set of calibration patterns includes line-space patterns, contacts, line-ends, and brick wall patterns.

50. The method of claim 46, wherein the set of calibration patterns includes line-space patterns with varying values of orientation, hexagonal patterns, or brick wall patterns for optimal calibration of optical aberration parameters.

51. The method of claim 35, wherein simulating the lithography process, simulating behavior of the image sensor array, and measuring the aerial image are performed for a range of patterns, process window conditions, and optical conditions.

52. The method of claim 51, wherein the range of patterns includes one or more of line-space patterns with varying pitch and line-end patterns.

53. The method of claim 51, wherein the process window conditions include one or more varying values of focus and exposure dose.

54. The method of claim 51, wherein the optical conditions include one or more varying values of numerical aperture and partial coherence.

55. A method for calibrating a model of a lithography process, comprising:
    selecting a model for a lithography process, the model including an optical model and a resist model, the optical model having initial values of optical model parameters and the resist model having initial values of resist model parameters;
    selecting an inverse sensor model for an image sensor array, the inverse sensor model having initial values of inverse sensor model parameters;
    measuring an aerial image using the image sensor array to produce a measured sensor image, the aerial image being produced by a lithography tool from a mask created using circuit design data;
    generating a reconstructed aerial image using the measured sensor image and the inverse sensor model;
    simulating the lithography process using the optical model and the circuit design data to produce a simulated aerial image;
    determining differences between the simulated aerial image and the reconstructed aerial image; and
    modifying the optical model parameters and the inverse sensor model parameters based on the differences between the simulated aerial image and the reconstructed aerial image to identify optimal values for the optical model parameters and optimal values for the inverse sensor model parameters, wherein a simulated aerial image produced using the optimal values for the optical model parameters is an optimal simulated aerial image that is a best match for the reconstructed aerial image.

56. The method of claim 55, further comprising:
    processing a wafer using the lithography process and the mask to produce printed resist patterns;
    measuring the printed resist patterns to produce measured resist patterns;
    simulating formation of resist patterns on a wafer using the resist model and the optimal simulated aerial image to produce simulated resist patterns;
    determining differences between the simulated resist patterns and the measured resist patterns; and
    modifying the values of the resist model parameters based on the differences between the simulated resist patterns and the measured resist patterns to identify optimal values for the resist model parameters, wherein simulated resist patterns produced using the optimal values for the resist model parameters are optimal simulated resist patterns that are a best match for the measured resist patterns.

57. The method of claim 56, wherein the optimal values for the resist model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

58. The method of claim 56, wherein the differences between the simulated resist patterns and the measured resist patterns include one or more values of critical dimension, resist thickness, sidewall angle, resist profile, footing, and top-profile rounding.

59. The method of claim 55, wherein the optimal values for the optical model parameters and the optimal values for the inverse sensor model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

60. The method of claim 55, wherein the differences between the simulated aerial image and the reconstructed aerial image include one or more values of image intensity, image slope, image contrast, critical dimension, line-end pullback, and corner rounding.

61. The method of claim 55, wherein the image sensor array is disposed in an image sensor unit capable of being loaded into the wafer stage of an exposure tool.

62. The method of claim 55, wherein the image sensor array is disposed in an image sensor unit that is integrated into an exposure tool.

63. The method of claim 55, wherein the circuit design data are a set of calibration patterns.

64. The method of claim 63, wherein the set of calibration patterns includes patterns covering a wide area of a pattern parameter space that are sensitive to process variations.

65. The method of claim 64, wherein the patterns have varying values of size and pitch.

66. The method of claim 63, wherein the set of calibration patterns includes line-space patterns, contacts, line-ends, and brick wall patterns.

67. The method of claim 63, wherein the set of calibration patterns includes line-space patterns with varying values of orientation, hexagonal patterns, or brick wall patterns for optimal calibration of optical aberration parameters.

68. The method of claim 55, wherein measuring the aerial image, generating the reconstructed aerial image, and simulating the lithography process are performed for a range of patterns, process window conditions, and optical conditions.

69. The method of claim 68, wherein the range of patterns includes one or more of line-space patterns with varying pitch and line-end patterns.

70. The method of claim 68, wherein the process window conditions include one or more varying values of focus and exposure dose.

71. The method of claim 68, wherein the optical conditions include one or more varying values of numerical aperture and partial coherence.

72. A method for calibrating a model of a lithography process, comprising:
- selecting a model for a lithography process, the model including an optical model and a resist model, the optical model having initial values of optical model parameters and the resist model having initial values of resist model parameters;
- selecting a sensor model for an image sensor array, the sensor model having values of sensor model parameters;
- measuring an aerial image using the image sensor array to produce a measured sensor image, the aerial image being produced by a lithography tool from a mask created using circuit design data;
- processing a wafer using the lithography process and the mask to produce printed resist patterns;
- measuring the printed resist patterns to produce measured resist patterns;
- simulating behavior of the image sensor array using the optical model, the circuit design data, and the sensor model to produce a simulated sensor image;
- determining differences between the measured sensor image and the simulated sensor image;
- simulating the lithography process using the optical model and the circuit design data to produce a simulated aerial image;
- simulating formation of resist patterns on a wafer using the resist model and the simulated aerial image to produce simulated resist patterns;
- determining differences between the simulated resist patterns and the measured resist patterns; and
- modifying the values of the optical model parameters and the resist model parameters based on a total difference between the simulated resist patterns and the measured resist patterns as well as between the measured sensor image and the simulated sensor image to identify optimal values for the optical model parameters and optimal values for the resist model parameters simultaneously, wherein simulated resist patterns produced using the optimal values for the resist model parameters are optimal simulated resist patterns that are a best match for the measured resist patterns, and wherein a simulated sensor image produced using the optimal values for the optical model parameters is an optimal simulated sensor image that is a best match for the measured sensor image.

73. The method of claim 72, wherein the optimal values for the optical model parameters and the optimal values for the resist model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

74. The method of claim 72, wherein the differences between the simulated sensor image and the measured sensor image include one or more values of image intensity, image slope, image contrast, critical dimension, line-end pullback, and corner rounding.

75. The method of claim 72, wherein the differences between the simulated resist patterns and the measured resist patterns include one or more values of critical dimension, resist thickness, sidewall angle, resist profile, footing, and top-profile rounding.

76. The method of claim 72, wherein the image sensor array is disposed in an image sensor unit that is capable of being loaded into the wafer stage of an exposure tool.

77. The method of claim 72, wherein the image sensor array is disposed in an image sensor unit that is integrated into an exposure tool.

78. The method of claim 72, wherein the circuit design data are a set of calibration patterns.

79. The method of claim 78, wherein the set of calibration patterns includes patterns covering a wide area of a pattern parameter space that are sensitive to process variations.

80. The method of claim 79, wherein the patterns have varying values of size and pitch.

81. The method of claim 78, wherein the set of calibration patterns includes line-space patterns, contacts, line-ends, and brick wall patterns.

82. The method of claim 78, wherein the set of calibration patterns includes line-space patterns with varying values of orientation, hexagonal patterns, or brick wall patterns for optimal calibration of optical aberration parameters.

83. The method of claim 72, wherein simulating the lithography process, simulating behavior of the image sensor array, and measuring the aerial image are performed for a range of patterns, process window conditions, and optical conditions.

84. The method of claim 83, wherein the range of patterns includes one or more of line-space patterns with varying pitch and line-end patterns.

85. The method of claim 83, wherein the process window conditions include one or more varying values of focus and exposure dose.

86. The method of claim 83, wherein the optical conditions include one or more varying values of numerical aperture and partial coherence.

87. A computer-readable medium containing instructions for calibrating a model of a lithography process by performing:
- storing a model for a lithography process, the model including an optical model and a resist model, the optical model having initial values of optical model parameters, and the resist model having initial values of resist model parameters;
- storing a sensor model for an image sensor array, the sensor model having initial values of sensor model parameters;
- receiving a measured sensor image produced by measuring an aerial image using the image sensor array, the aerial image produced by a lithography tool from a mask created using circuit design data;
- simulating the lithography process using the optical model and the circuit design data to produce a simulated aerial image;
- simulating behavior of the image sensor array using the simulated aerial image and the sensor model to produce a simulated sensor image;
- determining differences between the simulated sensor image and the measured sensor image; and
- modifying the optical model parameters and the sensor model parameters based on the differences between the simulated sensor image and the measured sensor image to identify optimal values for the optical model parameters and optimal values for the sensor model parameters, wherein a simulated sensor image produced using the optimal values for the optical model parameters and the optimal values for the sensor model parameters is an optimal simulated sensor image that is a best match for the measured sensor image.

88. The computer-readable medium of claim 87, containing further instructions for performing:

receiving measured resist patterns of resist patterns printed onto a wafer using the lithography process and the mask;

simulating the lithography process using the optical model with the optimal optical model parameters to produce an optimal simulated aerial image;

simulating formation of resist patterns on a wafer using the resist model and the optimal simulated aerial image to produce simulated resist patterns;

determining differences between the simulated resist patterns and the measured resist patterns; and modifying values of resist model parameters of the resist model based on the differences between the simulated resist patterns and the measured resist patterns to identify optimal values for the resist model parameters, wherein simulated resist patterns produced using the optimal values for the resist model parameters are optimal simulated resist patterns that are a best match for the measured resist patterns.

89. The computer-readable medium of claim 88, wherein the optimal values for the resist model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

90. The computer-readable medium of claim 88, wherein the differences between the simulated resist patterns and the measured resist patterns include one or more values of critical dimension, resist thickness, sidewall angle, resist profile, footing, and top-profile rounding.

91. The computer-readable medium of claim 87, containing further instructions for performing:

receiving measured resist patterns of resist patterns printed onto a wafer using the lithography process and the mask;

simulating formation of resist patterns on a wafer using the resist model and the optimal simulated sensor image to produce simulated resist patterns;

determining differences between the simulated resist patterns and the measured resist patterns; and modifying the values of the resist model parameters based on the differences between the simulated resist patterns and the measured resist patterns to identify optimal values for the resist model parameters, wherein simulated resist patterns produced using the optimal values for the resist model parameters are optimal simulated resist patterns that are a best match for the measured resist patterns.

92. The computer-readable medium of claim 91, wherein the optimal values for the resist model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

93. The computer-readable medium of claim 91, wherein the differences between the simulated resist patterns and the measured resist patterns include one or more values of critical dimension, resist thickness, sidewall angle, resist profile, footing, and top-profile rounding.

94. The computer-readable medium of claim 87, wherein the optimal values for the optical model parameters and the optimal values for the sensor model parameters are identified using one or more of a set of fitting algorithms, the set of fitting algorithms including minimizing Root-Mean-Square (RMS) errors, removing outliers, minimizing maximum residual errors, and using weighting factors to preferentially fit specific points, regions, metrics, or optical conditions.

95. The computer-readable medium of claim 87, wherein the differences between the simulated sensor image and the measured sensor image include one or more values of image intensity, image slope, image contrast, critical dimension, line-end pullback, and corner rounding.

96. The computer-readable medium of claim 87, wherein the circuit design data are a set of calibration patterns.

97. The computer-readable medium of claim 96, wherein the set of calibration patterns includes patterns covering a wide area of a pattern parameter space that are sensitive to process variations.

98. The computer-readable medium of claim 97, wherein the patterns have varying values of size and pitch.

99. The computer-readable medium of claim 96, wherein the set of calibration patterns includes line-space patterns, contacts, line-ends, and brick wall patterns.

100. The computer-readable medium of claim 96, wherein the set of calibration patterns includes line-space patterns with varying values of orientation, hexagonal patterns, or brick wall patterns for optimal calibration of optical aberration parameters.

101. The computer-readable medium of claim 87, wherein simulating the lithography process and measuring the aerial image are performed for a range of patterns, process window conditions, and optical conditions.

102. The computer-readable medium of claim 101, wherein the range of patterns includes one or more of line-space patterns with varying pitch and line-end patterns.

103. The computer-readable medium of claim 101, wherein the process window conditions include one or more varying values of focus and exposure dose.

104. The computer-readable medium of claim 101, wherein the optical conditions include one or more varying values of numerical aperture and partial coherence.

* * * * *